(12) United States Patent
Knoppert et al.

(10) Patent No.: US 11,157,094 B2
(45) Date of Patent: Oct. 26, 2021

(54) TOUCH INPUT SWITCHING FOR MULTI-FORM FACTOR INFORMATION HANDLING SYSTEM (IHS)

(71) Applicant: Dell Products, L.P., Round Rock, TX (US)

(72) Inventors: Michiel Sebastiaan Emanuel Petrus Knoppert, Amsterdam (NL); Mark R. Ligameri, Santa Rosa, FL (US)

(73) Assignee: Dell Products, L.P., Round Rock, TX (US)

( * ) Notice: Subject to any disclaimer, the term of this patent is extended or adjusted under 35 U.S.C. 154(b) by 0 days.

(21) Appl. No.: 16/218,070

(22) Filed: Dec. 12, 2018

(65) Prior Publication Data
US 2020/0192497 A1 Jun. 18, 2020

(51) Int. Cl.
*G06F 3/0354* (2013.01)
*G06F 9/30* (2018.01)
(Continued)

(52) U.S. Cl.
CPC ........ *G06F 3/03545* (2013.01); *G06F 1/1643* (2013.01); *G06F 1/1681* (2013.01); *G06F 3/038* (2013.01); *G06F 3/03547* (2013.01); *G06F 3/0412* (2013.01); *G06F 9/30003* (2013.01); *H03K 17/96* (2013.01); *G06F 2203/0381* (2013.01); *G06F 2203/0382* (2013.01); *G06F 2203/04106* (2013.01)

(58) Field of Classification Search
CPC .. G06F 3/03545; G06F 3/03547; G06F 3/038; G06F 3/0412; G06F 1/1641; G06F 1/1643; G06F 1/1647; G06F 1/1681; G06F 9/3003; G06F 2203/0381; G06F 2203/0382; G06F 2203/04104; G06F 2203/04106; H03K 17/96
See application file for complete search history.

(56) References Cited

U.S. PATENT DOCUMENTS 5,739,810 A  4/1998  Merkel
5,847,698 A  12/1998 Reavey et al.
(Continued)

OTHER PUBLICATIONS

Binary Fortress Software, "Precise Monitor Controls," 2017-2018, 2 pages, retrieved Oct. 15, 2018, available at https://www.displayfusion.com/Features/MonitorConfig/.
(Continued)

*Primary Examiner* — Kenneth Bukowski
(74) *Attorney, Agent, or Firm* — Fogarty LLP

(57) ABSTRACT

Embodiments of systems and methods for providing touch input switching in a multi-form factor Information Handling System (IHS) are described. In an illustrative, non-limiting embodiment, an IHS may include a processor and a memory coupled to the processor, the memory having program instructions stored thereon that, upon execution by the processor, cause the IHS to: process a first input received via a secondary display in direct mode, at least in part, by producing or modifying an image on the secondary display; and in response to an event, process a second input received via the secondary display in pointer mode, at least in part, by producing or modifying an image on a primary display at a display location that corresponds to a contact location of the second input.

20 Claims, 14 Drawing Sheets

(51) Int. Cl.
*H03K 17/96* (2006.01)
*G06F 3/041* (2006.01)
*G06F 1/16* (2006.01)
*G06F 3/038* (2013.01)

(56) References Cited

U.S. PATENT DOCUMENTS

| | | | |
|---|---|---|---|
| 6,510,048 | B2 | 1/2003 | Rubenson et al. |
| 6,700,773 | B1 | 3/2004 | Adriaansen et al. |
| 6,922,333 | B2 | 7/2005 | Weng et al. |
| 7,061,472 | B1 | 7/2006 | Schweizer et al. |
| 7,551,428 | B2 | 7/2009 | Homer et al. |
| 7,663,602 | B2 | 2/2010 | Jones et al. |
| 7,990,702 | B2 | 8/2011 | Tracy et al. |
| 7,991,442 | B2 | 8/2011 | Kim |
| 8,310,823 | B2 | 11/2012 | Stoltz |
| 8,331,098 | B2 | 12/2012 | Leung |
| 8,803,816 | B2 | 8/2014 | Kilpatrick, II et al. |
| 8,988,876 | B2 | 3/2015 | Corbin et al. |
| 9,684,342 | B2 | 6/2017 | Kim et al. |
| 9,740,237 | B2 | 8/2017 | Moore et al. |
| 9,874,908 | B2 | 1/2018 | Han et al. |
| 2004/0001049 | A1 | 1/2004 | Oakley |
| 2006/0183505 | A1* | 8/2006 | Willrich ................ G06F 1/1616 455/566 |
| 2006/0187142 | A1* | 8/2006 | Lesniak ................ G09G 5/393 345/1.1 |
| 2009/0244016 | A1 | 10/2009 | Casparian et al. |
| 2010/0083122 | A1* | 4/2010 | Kozloski ................ G06F 3/023 715/737 |
| 2010/0238620 | A1 | 9/2010 | Fish |
| 2010/0321275 | A1 | 12/2010 | Hinckley et al. |
| 2011/0047459 | A1* | 2/2011 | Van Der Westhuizen ................... G06F 1/1692 715/702 |
| 2012/0169622 | A1* | 7/2012 | Grossman ............. G06F 3/0416 345/173 |
| 2015/0103014 | A1* | 4/2015 | Kim ...................... G06F 3/0304 345/173 |
| 2016/0342258 | A1* | 11/2016 | Han ........................ G06F 3/033 |
| 2017/0069299 | A1 | 3/2017 | Kwak et al. |
| 2017/0255320 | A1 | 9/2017 | Kumar et al. |
| 2017/0344120 | A1 | 11/2017 | Zuniga et al. |
| 2018/0088632 | A1 | 3/2018 | Dreessen et al. |
| 2018/0121012 | A1 | 5/2018 | Asrani |
| 2018/0129391 | A1 | 5/2018 | Files et al. |
| 2018/0164910 | A1* | 6/2018 | Ent ........................ G06F 1/1618 |
| 2018/0188774 | A1 | 7/2018 | Ent et al. |
| 2018/0232010 | A1 | 8/2018 | Kummer et al. |
| 2019/0064938 | A1* | 2/2019 | Klein .................... G06F 40/171 |
| 2019/0114021 | A1* | 4/2019 | Oliver ..................... G06F 3/048 |
| 2019/0384362 | A1* | 12/2019 | Xing .................. G06F 3/04886 |
| 2020/0034017 | A1* | 1/2020 | Lin ..................... G06F 3/03547 |

OTHER PUBLICATIONS

Microsoft, "ChangeDisplaySettingsExA function," 7 pages, retrieved Oct. 15, 2018, available at https://msdn.microsoft.com/en-us/library/dd183413(v=vs.85).aspx VS. https://docs.microsoft.com/en-us/windows/desktop/api/winuser/nf-winuser-changedisplaysettingsexa.

Microsoft, "SendKeys.Send(String) Method," 6 pages, retrieved Oct. 11, 2018, available at https://msdn.microsoft.com/en-us/library/system.windows.forms.sendkeys.send(v=vs.110).aspx.

Microsoft, "DoDragDrop function," 4 pages, retrieved Oct. 11, 2018, available at https://msdn.microsoft.com/en-us/library/windows/desktop/ms678486(v=vs85).aspx.

Microsoft, "System Events and Mouse Messages," published May 30, 2018, 4 pages, retrieved Oct. 11, 2018, available at https://msdn.microsoft.com/en-us/library/windows/desktop/ms703320(v=vs.85).aspx.

Microsoft, "InkSystemGesture Enumeration," 3 pages, retrieved Oct. 11, 2018, available at https://msdn.microsoft.com/en-us/library/windows/desktop/ms695579(v=vs.85).aspx.

Microsoft, "GetWindowRect function," 3 pages, retrieved Oct. 11, 2018, available at https://msdn.microsoft.com/en-us/library/windows/desktop/ms633519(v=vs.85).aspx.

Microsoft, "PointerRoutedEventArgs Class," 9 pages, retrieved Oct. 11, 2018, available at https://docs.microsoft.com/en-us/uwp/api/Windows.UI.Xaml.Input.PointerRoutedEventArgs#Windows_UI_Xaml_Input_PointerRoutedEventArgs_GetCurrentPoint_Windows_UI_Xaml_UIElement.

Microsoft, "SetWindowPos function," 7 pages, retrieved Oct. 11, 2018, available at https://msdn.microsoft.com/en-us/library/windows/desktop/ms633545(v=vs.85).aspx.

Microsoft, "Time Functions," published May 30, 2018, 5 pages, retrieved Oct. 11, 2018, available at https://msdn.microsoft.com/en-us/library/windows/desktop/ms725473(v=vs.85).aspx.

Microsoft, "How Do I Detect a Window Open Event," 11 pages, retrieved Oct. 15, 2018, available at https://social.msdn.microsoft.com/Forums/vstudio/en-US/1953f400-6f1c-49e0-a63e-d724bccc7676/how-do-i-detect-a-window-open-event?forum=csharpgeneral.

Microsoft, "How Do I Maximize/Minimize Applications Programmatically in C#?," 2 pages, retrieved Oct. 15, 2018, available at https://social.msdn.microsoft.com/Forums/vstudio/en-US/9bde4870-1599-4958-9ab4-902fa98ba53a/how-do-i-maximizeminimize-applications-programmatically-in-c?forum=csharpgeneral.

Microsoft, "WinMain Entry Point," 7 pages, retrieved Oct. 15, 2018, available at https://msdn.microsoft.com/en-us/library/ms633559(vs.85).aspx.

Stack Overflow, "How Can I Split a Window in Two in Windows API," 6 pages, retrieved Oct. 15, 2018, available at https://stackoverflow.com/questions/10467112/how-can-i-split-a-window-in-two-in-windows-api.

Microsoft, "Application User Model IDs (AppUserModelIDs)," published May 30, 2018, 8 pages, retrieved Oct. 15, 2018, available at https://docs.microsoft.com/en-us/windows/desktop/shell/appids.

Microsoft, "Mouse Events in Windows Forms," published Mar. 29, 2017, 6 pages, retrieved Oct. 15, 2018, available at https://docs.microsoft.com/en-us/dotnet/framework/winforms/mouse-events-in-windows-forms.

* cited by examiner

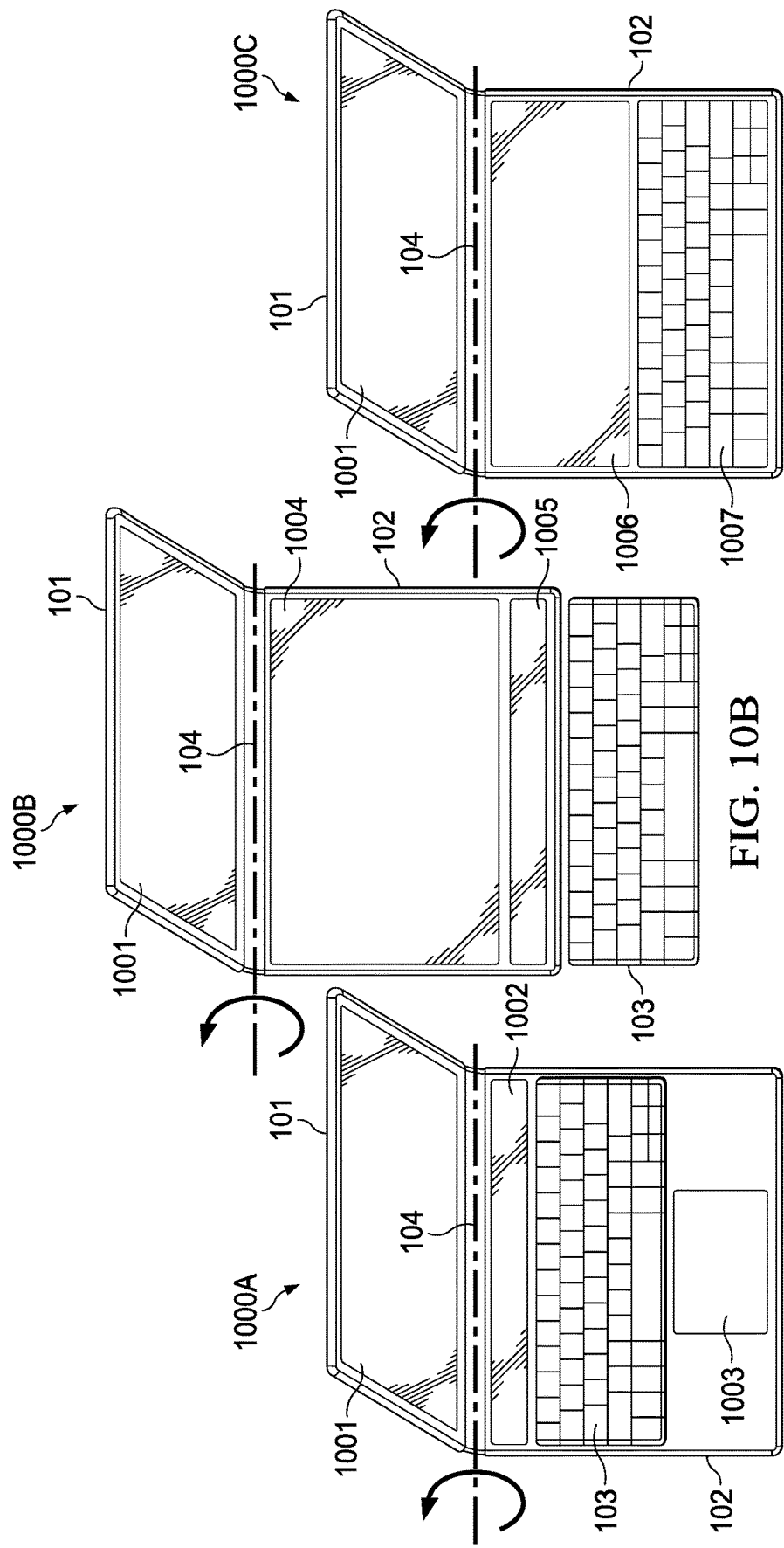

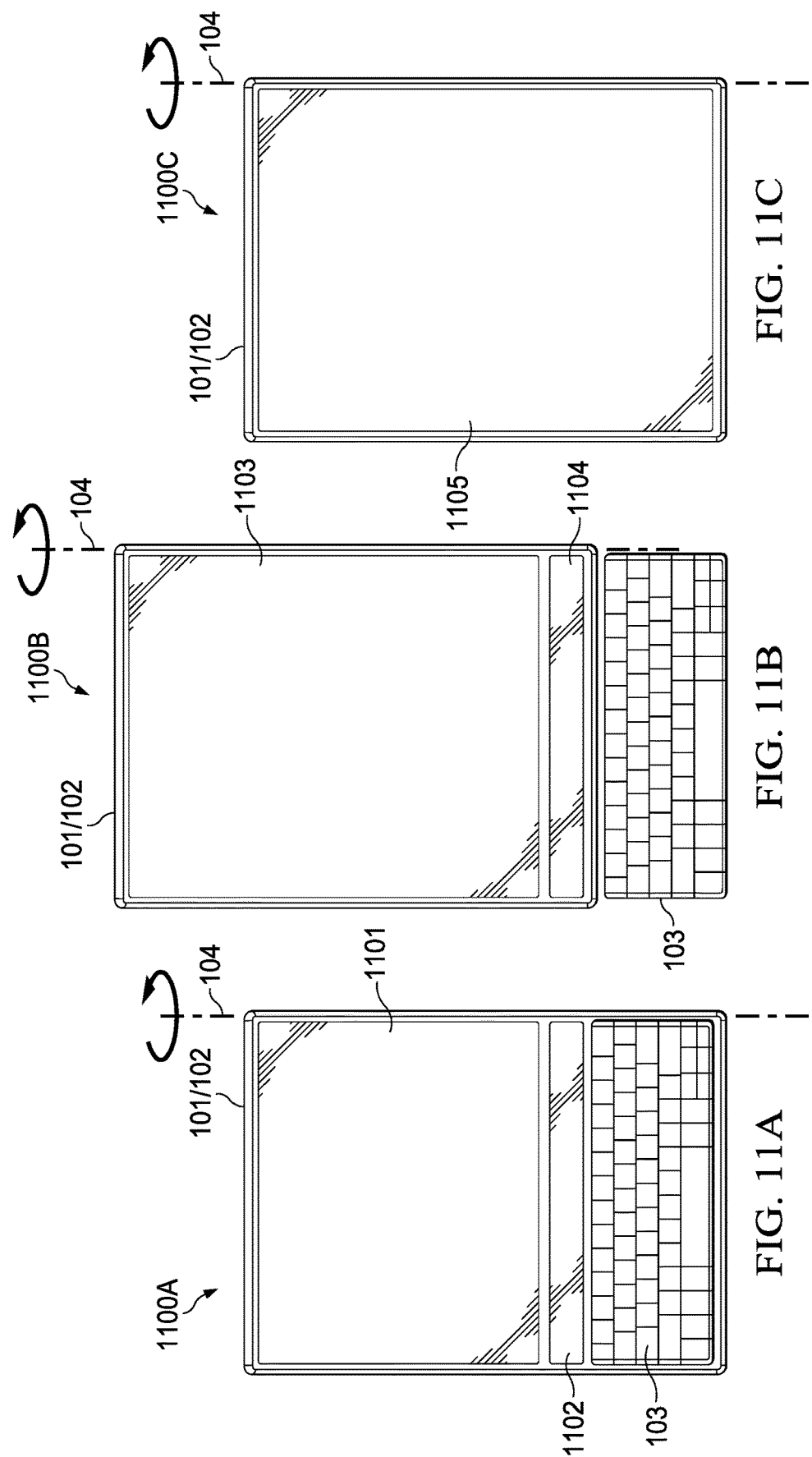

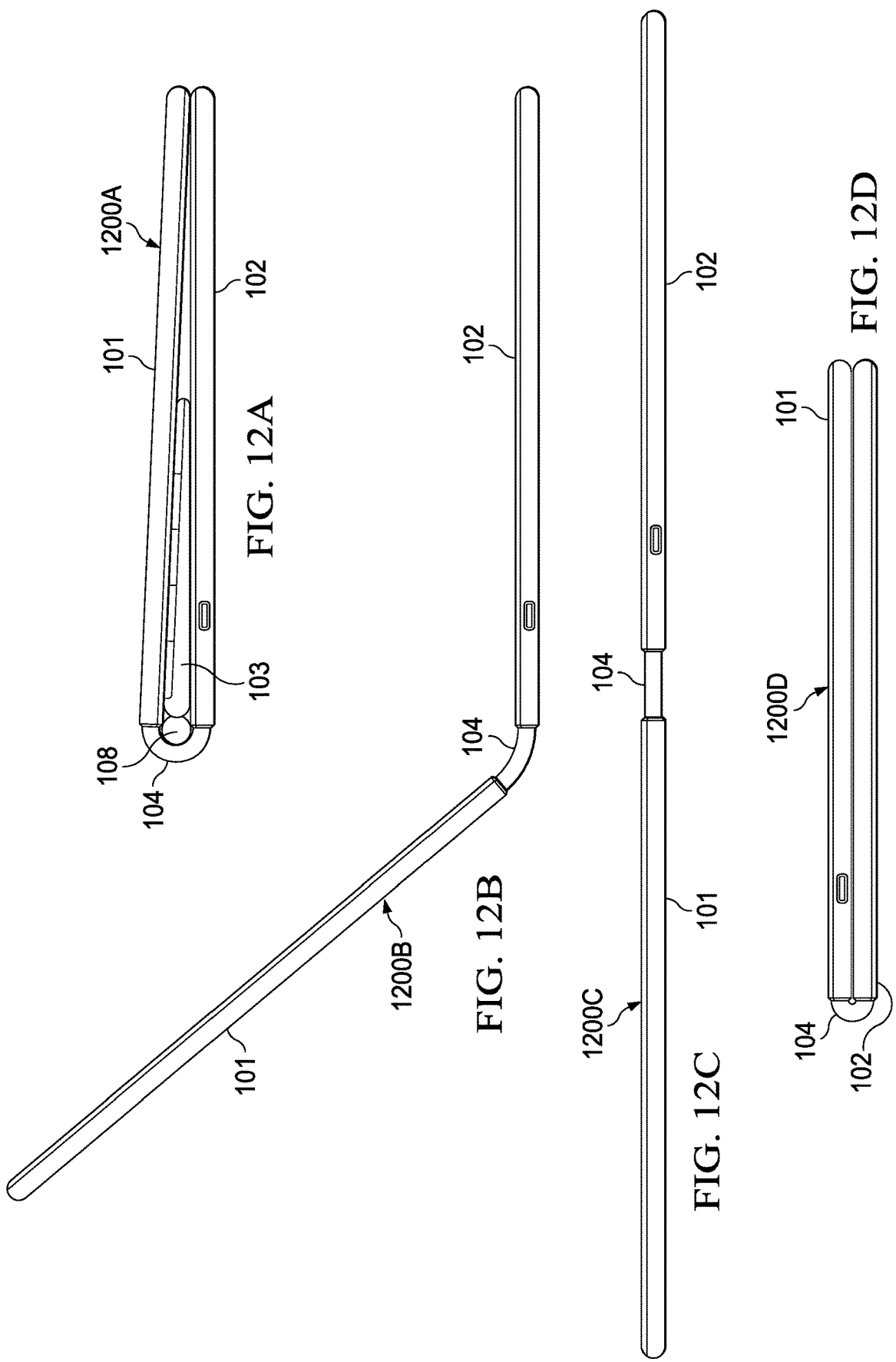

TOUCH INPUT SWITCHING FOR MULTI-FORM FACTOR INFORMATION HANDLING SYSTEM (IHS)

FIELD

This disclosure relates generally to Information Handling Systems (IHSs), and more specifically, to systems and methods for providing touch input switching for a multi-form factor IHS.

BACKGROUND

As the value and use of information continues to increase, individuals and businesses seek additional ways to process and store information. One option available to users is Information Handling Systems (IHSs). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Nowadays, users can choose among many different types of mobile IHS devices. Each type of device (e.g., tablets, 2-in-1s, mobile workstations, notebooks, netbooks, ultra-books, etc.) has unique portability, performance, and usability features; however, each also has its own trade-offs and limitations. For example, tablets have less compute power than notebooks and workstations, while notebooks and workstations lack the portability of tablets. A conventional 2-in-1 device combines the portability of a tablet with the performance of a notebook, but with a small display—an uncomfortable form factor in many use-cases.

The inventors hereof have determined that, as productivity continues to be a core tenet of modern computing, mobile IHS devices should provide versatility for many use-cases and display postures in use today (e.g., tablet mode, laptop mode, etc.), as well as future display postures (e.g., digital notebooks, new work surfaces, etc.). Additionally, mobile IHS devices should provide larger display area with reduced size and weight.

SUMMARY

Embodiments of systems and methods for providing touch input switching for a multi-form factor IHS are described. In an illustrative, non-limiting embodiment, an IHS may include a processor and a memory coupled to the processor, the memory having program instructions stored thereon that, upon execution by the processor, cause the IHS to: process a first input received via a secondary display in direct mode, at least in part, by producing or modifying an image on the secondary display; and in response to an event, process a second input received via the secondary display in pointer mode, at least in part, by producing or modifying an image on a primary display at a display location that corresponds to a contact location of the second input.

The program instructions, upon execution by the processor, may cause the IHS to detect the event in response to actuation of a switch on a stylus. For example, the event may include a two-finger gesture, and wherein the memory, upon execution by the processor, further cause the IHS to increase a cursor speed in response to the event. Additionally, or alternatively, the event may include a flick gesture.

The program instructions, upon execution by the processor, may cause the IHS to: determine that content is selected prior to the event; and in response to the event, move the content between the primary and secondary displays. Additionally, or alternatively, in response to the event, the IHS may a display setting of the secondary display. The display setting may include a brightness or a palm rejection setting. The secondary display may be integrated into the IHS, and the primary display may include an external monitor. Additionally, or alternatively, the primary display may be coupled to the secondary display via a hinge, and the IHS may detect the event in response to a change in an angle of the hinge.

The program instructions, upon execution by the processor, may cause the IHS to: display a trackpad on the secondary display; and in response to a touch event detected on a top section of the trackpad, transport a cursor from the secondary display to the primary display. The program instructions, upon execution by the processor, further cause the IHS to: display a trackpad on the secondary display; and in response to a touch event detected on a bottom section of the trackpad, transport a cursor from the primary display to the secondary display.

In another illustrative, non-limiting embodiment, a method may include processing a first input received via a touchscreen or digitizer of a secondary display in direct mode; and in response to content being flicked from the secondary display to a primary display, processing a second input received via a touchscreen or digitizer of the secondary display secondary display in pointer mode.

Processing the first input in direct mode may include producing or modifying an image rendered on the secondary display, and processing the second input in pointer mode may include producing or modifying an image rendered on the primary display. In response to the content or other content being flicked from the primary display to the secondary display, the method may include processing a third input received via the touchscreen or digitizer of the secondary display in direct mode.

In response to a touch event being detected at a top section of an on-screen trackpad, the method may include moving a cursor form the secondary display to the primary display. In response to a touch event being detected at a bottom section of an on-screen trackpad, the method may include moving a cursor from the primary display to the secondary display.

In another illustrative, non-limiting embodiment, a hardware memory device may have program instructions stored thereon that, upon execution by a processor of an IHS, cause the IHS to: receive a first input via a secondary display; process the first input in direct mode, at least in part, by producing or modifying an image rendered on the secondary display; detect a switch event; receive a second input via the secondary display; and process the second input in pointer mode, at least in part, by producing or modifying an image rendered on the primary display. For example, the first and second inputs may be received via a touchscreen or digitizer built into the secondary display.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

FIGS. 10A-C and 11A-C illustrate various use-cases, according to some embodiments.

FIGS. 12A-D illustrate a hinge implementation, according to some embodiments.

DETAILED DESCRIPTION

To facilitate explanation of the various systems and methods discussed herein, the following description has been split into sections. It should be noted, however, that any sections, headings, and subheadings used herein are for organizational purposes only, and are not meant to limit or otherwise modify the scope of the description nor the claims.

Overview

Embodiments described herein include systems and methods for providing touch input switching in a multi-form factor Information Handling System (IHS). In various implementations, a mobile IHS device may include a dual-display, foldable IHS. Each display may include, for example, a Liquid Crystal Display (LCD), Organic Light-Emitting Diode (OLED), or Active Matrix OLED (AMO-LED) panel or film, equipped with a touchscreen configured to receive touch inputs. The dual-display, foldable IHS may be configured by a user in any of a number of display postures, including, but not limited to: laptop, tablet, book, clipboard, stand, tent, and/or display.

A user may operate the dual-display, foldable IHS in various modes using a virtual, On-Screen Keyboard (OSK), or a removable, physical keyboard. In some use cases, a physical keyboard may be placed atop at least one of the screens to enable use of the IHS as a laptop, with additional User Interface (UI) features (e.g., virtual keys, touch input areas, etc.) made available via the underlying display, around the keyboard. In other use cases, the physical keyboard may be placed in front of the IHS to expose a larger display area. The user may also rotate the dual-display, foldable IHS, to further enable different modalities with the use of the physical keyboard. In some cases, when not in use, the physical keyboard may be placed or stored inside the dual-display, foldable IHS.

Figure 1:
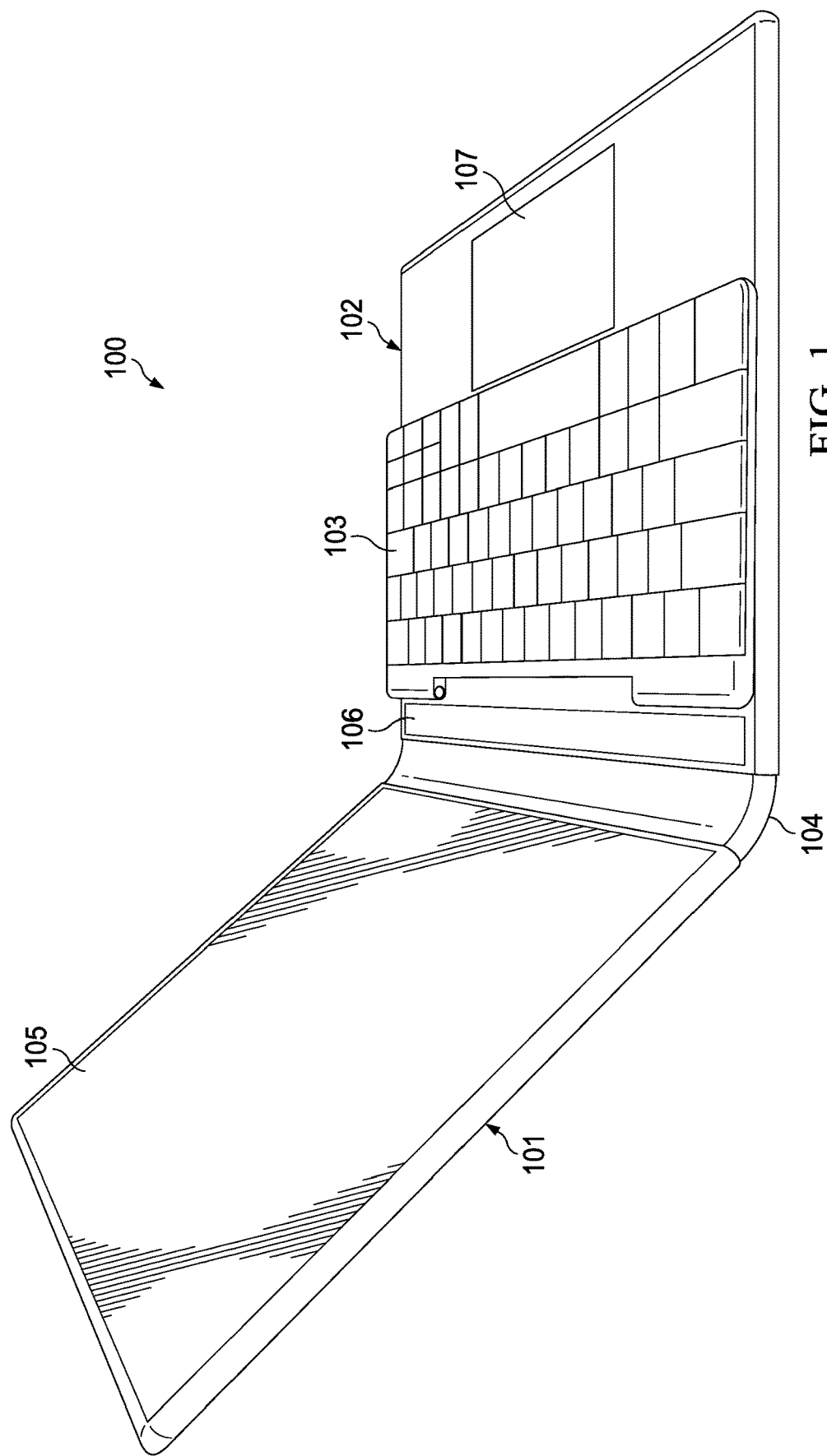
FIG. 1 is a perspective view of a multi-form factor Information Handling System (IHS) with a removable keyboard, according to some embodiments.

FIG. 1 is a perspective view of multi-form factor Information Handling System (IHS) 100 with removable keyboard 103. As shown, first display 101 is coupled to second display 102 via hinge 104, and keyboard 103 sits atop second display 102. The current physical arrangement of first display 101 and second display 102 creates a laptop posture, such that first display 101 becomes primary display area 105 presented by IHS 100, where video or display frames may be rendered for viewing by a user.

According to various embodiments, each of displays 101 and 102 may implement a display surface and an integrated touch screen digitizer. Examples of touchscreens or digitizers include, but are not limited to, a resistive touch surface, a surface acoustic wave touch surface, a capacitive touch surface, an infrared detection touch surface, etc. Moreover, touch instruments operable with displays 101 and 102 may include one or more fingers, a stylus or pen 108, a manually controlled pointing device, a totem (e.g., a DELL totem), etc.

In operation, in this particular laptop posture, second display 102 may sit horizontally on a work surface with its display surface facing up, and keyboard 103 may be positioned on top of second display 102, occluding a part of its display surface. In response to this posture and keyboard position, IHS 100 may dynamically produce a first UI feature in the form of at least one configurable secondary display area 106 (a "ribbon area" or "touch bar"), and/or a second UI feature in the form of at least one configurable touch input area 107 (a "virtual trackpad"), using the touchscreen of second display 102.

To identify a current posture of IHS 100 and a current physical relationship or spacial arrangement (e.g., distance, position, speed, etc.) between display(s) 101/102 and keyboard 103, IHS 100 may be configured to use one or more sensors disposed in first display 101, second display 102, keyboard 103, and/or hinge 104. Based upon readings from these various sensors, IHS 100 may then select, configure, modify, and/or provide (e.g., content, size, position, etc.) one or more UI features.

In various embodiments, displays 101 and 102 may be coupled to each other via hinge 104 to thereby assume a plurality of different postures, including, but not limited, to: laptop, tablet, book, or display.

When display 102 is disposed horizontally in laptop posture, keyboard 103 may be placed on top of display 102, thus resulting in a first set of UI features (e.g., ribbon area or touch bar 106, and/or touchpad 107). Otherwise, with IHS 100 still in the laptop posture, keyboard 103 may be placed next to display 102, resulting in a second set of UI features.

As used herein, the term "ribbon area" or "touch bar" 106 refers to a dynamic horizontal or vertical strip of selectable and/or scrollable items, which may be dynamically selected for display and/or IHS control depending upon a present context, use-case, or application. For example, when IHS 100 is executing a web browser, ribbon area or touch bar 106 may show navigation controls and favorite websites. Then, when IHS 100 operates a mail application, ribbon area or touch bar 106 may display mail actions, such as replying or flagging. In some cases, at least a portion of ribbon area or touch bar 106 may be provided in the form of a stationary control strip, providing access to system features such as brightness and volume. Additionally, or alternatively, ribbon area or touch bar 106 may enable multitouch, to support two or more simultaneous inputs.

In some cases, ribbon area 106 may change position, location, or size if keyboard 103 is moved alongside a lateral or short edge of second display 102 (e.g., from horizontally displayed alongside a long side of keyboard 103 to being vertically displayed alongside a short side of keyboard 103). Also, the entire display surface of display 102 may show rendered video frames if keyboard 103 is moved alongside the bottom or long edge of display 102. Conversely, if keyboard 103 is removed of turned off, yet another set of UI features, such as an OSK, may be provided via display(s) 101/102. As such, in many embodiments, the distance and/or relative position between keyboard 103 and display(s) 101/ 102 may be used to control various aspects the UI.

During operation, the user may open, close, flip, swivel, or rotate either of displays 101 and/or 102, via hinge 104, to produce different postures. In each posture, a different arrangement between IHS 100 and keyboard 103 results in different UI features being presented or made available to the user. For example, when second display 102 is folded against display 101 so that the two displays have their backs against each other, IHS 100 may be said to have assumed a canvas posture (e.g., FIGS. 7A-F), a tablet posture (e.g., FIG. 7G-J), a book posture (e.g., FIG. 8D), a stand posture (e.g., FIGS. 9A and 9B), or a tent posture (e.g., FIGS. 9C and 9D), depending upon whether IHS 100 is stationary, moving, horizontal, resting at a different angle, and/or its orientation (landscape vs. portrait).

In many of these scenarios, placement of keyboard 103 upon or near display(s) 101/102, and subsequent movement or removal, may result in a different set of UI features than when IHS 100 is in laptop posture.

In many implementations, different types of hinges 104 may be used to achieve and maintain different display postures, and to support different keyboard arrangements. Examples of suitable hinges 104 include, but are not limited to: a 360-hinge (FIGS. 12A-D), a jaws hinge (FIGS. 13A and 13B), a watchband hinge (FIG. 15), a gear hinge (FIGS. 16A-C), and a slide hinge (FIGS. 17A and 17B). One or more of these hinges 104 may include wells or compartments (FIG. 14) for docking, cradling, charging, or storing accessories. Moreover, one or more aspects of hinge 104 may be monitored via one or more sensors (e.g., to determine whether an accessory is charging) when controlling the different UI features.

In some cases, a folio case system (FIGS. 18A and 18B) may be used to facilitate keyboard arrangements. Additionally, or alternatively, an accessory backpack system (FIG. 19) may be used to hold keyboard 103 and/or an extra battery or accessory.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components.

Figure 2:
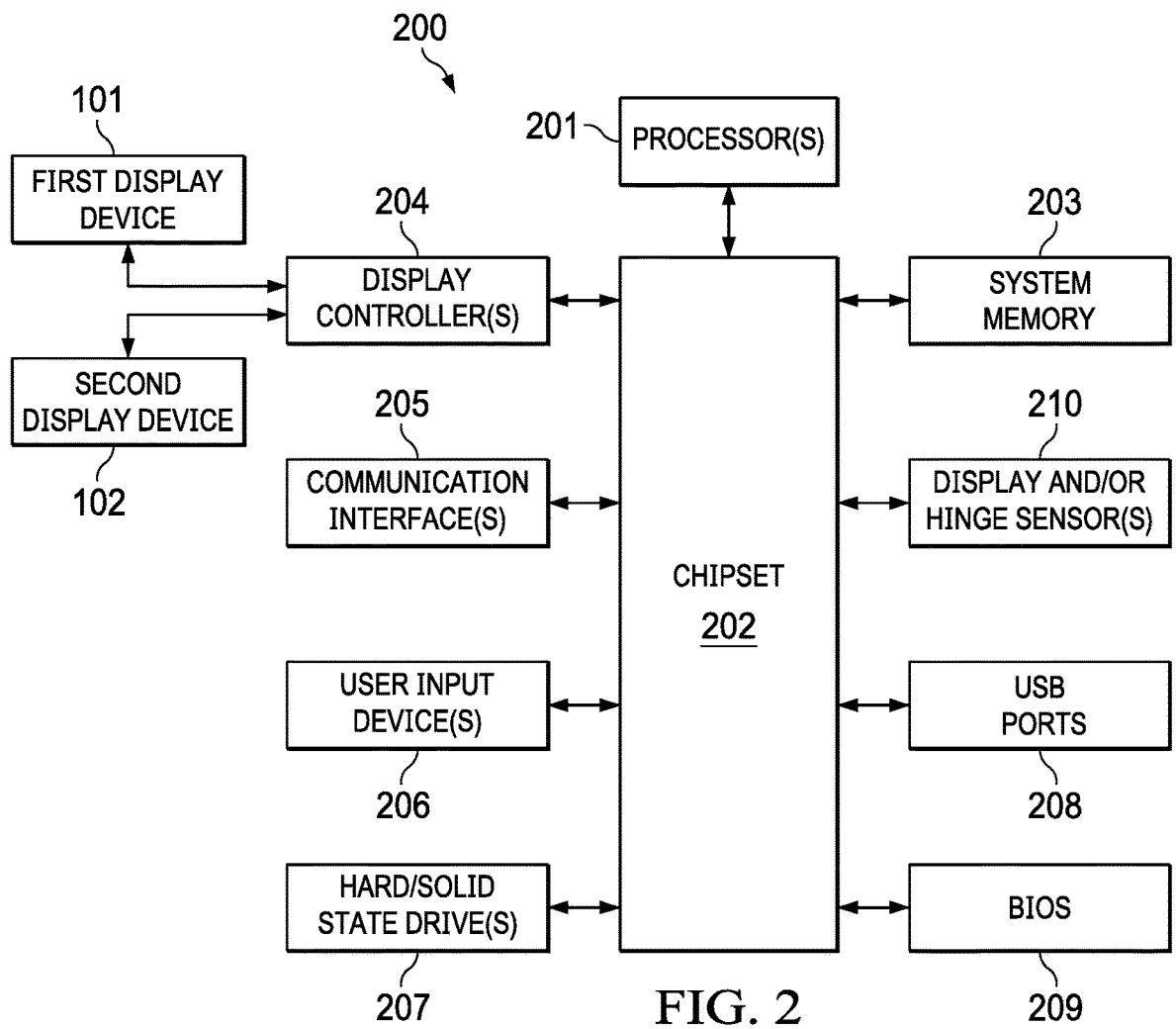
FIGS. 2 and 3 are block diagrams of components of the multi-form factor IHS and removable keyboard, respectively, according to some embodiments.

FIG. 2 is a block diagram of components 200 of multi-form factor IHS 100. As depicted, components 200 include processor 201. In various embodiments, IHS 100 may be a single-processor system, or a multi-processor system including two or more processors. Processor 201 may include any processor capable of executing program instructions, such as a PENTIUM series processor, or any general-purpose or embedded processors implementing any of a variety of Instruction Set Architectures (ISAs), such as an x86 ISA or a Reduced Instruction Set Computer (RISC) ISA (e.g., POWERPC, ARM, SPARC, MIPS, etc.).

IHS 100 includes chipset 202 coupled to processor 201. In certain embodiments, chipset 202 may utilize a QuickPath Interconnect (QPI) bus to communicate with processor 201. In various embodiments, chipset 202 may provide processor 201 with access to a number of resources. Moreover, chipset 202 may be coupled to communication interface(s) 205 to enable communications via various wired and/or wireless networks, such as Ethernet, WiFi, BLUETOOTH, cellular or mobile networks (e.g., CDMA, TDMA, LTE, etc.), satellite networks, or the like. For example, communication interface(s) 205 may be coupled to chipset 202 via a PCIe bus.

Chipset 202 may be coupled to display controller(s) 204, which may include one or more or graphics processor(s) (GPUs) on a graphics bus, such as an Accelerated Graphics Port (AGP) or Peripheral Component Interconnect Express (PCIe) bus. As shown, display controller(s) 204 provide video or display signals to first display device 101 and second display device 202. In other implementations, any number of display controller(s) 204 and/or display devices 101/102 may be used.

Each of display devices 101 and 102 may include a flexible display that is deformable (e.g., bent, folded, rolled, or stretched) by an external force applied thereto. For example, display devices 101 and 102 may include LCD, OLED, or AMOLED, plasma, electrophoretic, or electrowetting panel(s) or film(s). Each display device 101 and 102 may include a plurality of pixels arranged in a matrix, configured to display visual information, such as text, two-dimensional images, video, three-dimensional images, etc.

Display device(s) 101/102 may be configured to sense haptic and/or physical touch events, and to generate touch information. To this end, display device(s) 101/102 may include a touchscreen matrix (e.g., a layered capacitive panel or the like) and/or touch controller configured to receive and interpret multi-touch gestures from a user touching the screen with a stylus or one or more fingers. In some cases, display and touch control aspects of display device(s) 101/ 102 may be collectively operated and controlled by display controller(s) 204.

Within each of displays 101/102, a touchscreen or digitizer may be overlaid onto an LCD. As part of the manufacturing process of displays 101/102, a location on the touchscreen or digitizer layer within a display (e.g., a "contact location" in touchscreen coordinates) may be mapped to a corresponding location on the LCD layer of that same display (a "display location" in display coordinates). As such, IHS 100 often undergoes a calibration process, sometimes managed by the IHS's OS or configuration utility, whereby a set of visual targets is presented to a user, and the user touches stylus 108 (or a tip of their finger) to a contact location where the user perceives each target to be displayed. After calibration is completed, parallax values may be used to correct touch events—actual touch or hovering—in a manner that compensates for parallax effects (e.g., by subtracting an x-y offset from each touch event).

In some cases, display device(s) 101/102 may also comprise a deformation or bending sensor configured to generate deformation or bending information including, but not limited to: the bending position of a display (e.g., in the form of a "bending line" connecting two or more positions at which bending is detected on the display), bending direction, bending angle, bending speed, etc. In these implementations, display device(s) 101/102 may be provided as a single continuous display or film, rather than two discrete displays.

Chipset 202 may also provide processor 201 and/or display controller(s) 204 with access to memory 203. In various embodiments, system memory 203 may be implemented using any suitable memory technology, such as static RAM (SRAM), dynamic RAM (DRAM) or magnetic disks, or any nonvolatile/Flash-type memory, such as a solid-state drive (SSD) or the like. Memory 203 may store program instructions that, upon execution by processor 201 and/or controller(s) 204, present a UI interface to a user of IHS 100.

Chipset 202 may further provide access to one or more hard disk and/or solid-state drives 207. In certain embodiments, chipset 202 may also provide access to one or more optical drives or other removable-media drives. In certain embodiments, chipset 202 may also provide access to one or more Universal Serial Bus (USB) ports 208.

Upon booting of IHS 100, processor(s) 201 may utilize Basic Input/Output System (BIOS) 209 instructions to initialize and test hardware components coupled to IHS 100 and to load an Operating System (OS) for use by IHS 100. BIOS 209 provides an abstraction layer that allows the OS to interface with certain hardware components that are utilized by IHS 100. Via the hardware abstraction layer provided by BIOS 209, software stored in memory 203 and executed by the processor(s) 201 of IHS 100 is able to interface with certain I/O devices that are coupled to the IHS 100. The Unified Extensible Firmware Interface (UEFI) was designed as a successor to BIOS. As a result, many modern IHSs utilize UEFI in addition to or instead of a BIOS. As used herein, BIOS is intended to also encompass UEFI.

Chipset 202 may also provide access to one or more user input devices 206, for example, using a super I/O controller or the like. For instance, chipset 202 may provide access to a keyboard (e.g., keyboard 103), mouse, trackpad, stylus, totem, or any other peripheral input device, including touchscreen displays 101 and 102. These input devices may interface with chipset 202 through wired connections (e.g., in the case of touch inputs received via display controller(s) 204) or wireless connections (e.g., via communication interfaces(s) 205). In some cases, chipset 202 may be used to interface with user input devices such as keypads, biometric scanning devices, and voice or optical recognition devices.

In certain embodiments, chipset 202 may also provide an interface for communications with one or more sensors 210. Sensors 210 may be disposed within displays 101/102 and/or hinge 104, and may include, but are not limited to: electric, magnetic, radio, optical, infrared, thermal, force, pressure, acoustic, ultrasonic, proximity, position, deformation, bending, direction, movement, velocity, rotation, and/or acceleration sensor(s). In some cases, each of displays 101/102 may include a corresponding 9-DOF (degrees of freedom) sensor 210, or the like.

Figure 3:
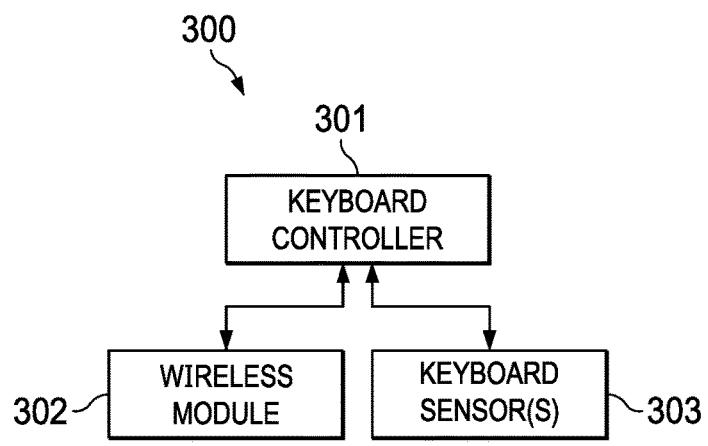

FIG. 3 is a block diagram of components 300 of keyboard 103. As depicted, components 300 include keyboard controller or processor 301, coupled to keyboard sensor(s) 303 and wireless communication module 302. In various embodiments, keyboard controller 301 may be configured to detect keystrokes made by user upon a keyboard matrix, and it may transmit those keystrokes to IHS 100 via wireless module 302 using a suitable protocol (e.g., BLUETOOTH). Keyboard sensors 303, which may also include any of the aforementioned types of sensor(s), may be disposed under keys and/or around the keyboard's enclosure, to provide information regarding the location, arrangement, or status of keyboard 103 to IHS 100 via wireless module 302. In other implementations, however, one or more keyboard sensors 303 (e.g., one or more Hall effect sensors, a magnetometer, etc.) may be disposed within first and/or second displays 101/102.

In some cases, a magnetic attachment and alignment system(s) may enable keyboard 103 to be attached to second display 102 (on the display surface, or on the back of display 102), and/or to be aligned on/off the surface of display 102, at predetermined locations. Moreover, display and/or hinge sensors 210 may be configured to determine which of a plurality of magnetic devices are presently engaged, so that the current position of keyboard 103 may be ascertained with respect to IHS 100. For example, keyboard 103 may have magnetic devices disposed along its short sides at selected locations. Moreover, second display 102 may include magnetic devices at locations that correspond to the keyboard's magnetic devices, and which snap keyboard 103 into any number of predetermined locations over the display surface of second display 102 alongside its short sides.

In various embodiments, systems and methods for on-screen keyboard detection may include a "fixed-position via Hall sensors" solution implemented as hardware/firmware that reads the multiple Hall sensors' information, calculates where a keyboard is detected, and sends the keyboard location (fixed positions) information to an OS. Additionally, or alternatively, these systems and methods may include a "variable-position via Hall sensors" solution implemented as hardware/firmware that reads a single Hall sensor's information based on the variable Gauss value of magnet(s) on keyboard 103.

Additionally, or alternatively, these systems and methods may include a "variable position via magnetometer" solution implemented as hardware/firmware that reads a single magnetometer's information based the relative location a single magnet on keyboard 103. Additionally, or alternatively, these systems and methods may include a "variable position via 3D Hall sensor" solution implemented as hardware/firmware that reads a 3D Hall sensor's information based the relative location a programmed magnet (different polarities) or array of magnets in different orientations on keyboard 103.

In some cases, by using magnetic keyboard detection, instead of relying upon touch sensors or the digitizer built into display 102, systems and methods described herein may be made less complex, using less power and fewer compute resources. Moreover, by employing a separate magnetic sensing system, IHS 100 may turn off touch in selected areas of display 102 such as, for example, in the areas of display 102 covered by keyboard 103.

In various embodiments, IHS 100 and/or keyboard 103 may not include all of components 200 and/or 300 shown in FIGS. 2 and 3, respectively. Additionally, or alternatively, IHS 100 and/or keyboard 103 may include components in addition to those shown in FIGS. 2 and 3, respectively. Additionally, or alternatively, components 200 and/or 300, represented as discrete in FIGS. 2 and 3, may be integrated with other components. For example, all or a portion of the functionality provided by components 200 and/or 300 may be provided as a System-On-Chip (SOC), or the like.

Figure 4:
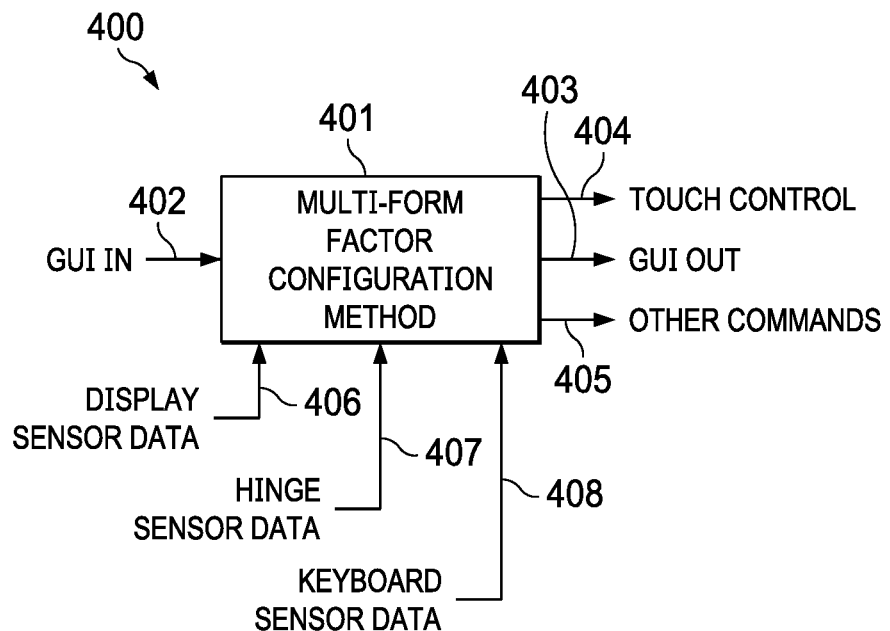
FIG. 4 is a block diagram of a multi-form factor configuration engine, according to some embodiments.

FIG. 4 is a block diagram of multi-form factor configuration engine 401. Particularly, multi-form factor configuration engine 401 may include electronic circuits and/or program instructions that, upon execution, cause IHS 100 to perform a number of operation(s) and/or method(s) described herein.

In various implementations, program instructions for executing multi-form factor configuration engine 401 may be stored in memory 203. For example, engine 401 may include one or more standalone software applications, drivers, libraries, or toolkits, accessible via an Application Programming Interface (API) or the like. Additionally, or alternatively, multi-form factor configuration engine 401 may be included the IHS's OS.

In other embodiments, however, multi-form factor configuration engine 401 may be implemented in firmware and/or executed by a co-processor or dedicated controller, such as a Baseband Management Controller (BMC), or the like.

As illustrated, multi-form factor configuration engine 401 receives Graphical User Interface (GUI) input or feature 402, and produces GUI output or feature 403, in response to receiving and processing one or more or: display sensor data 406, hinge sensor data 407, and/or keyboard sensor data 408. Additionally, or alternatively, multi-form factor configuration engine 401 may produce touch control feature 404 and/or other commands 405.

In various embodiments, GUI input 402 may include one or more images to be rendered on display(s) 101/102, and/or one or more entire or partial video frames. Conversely, GUI output 403 may include one or more modified images (e.g., different size, color, position on the display, etc.) to be rendered on display(s) 101/102, and/or one or more modified entire or partial video frames.

For instance, in response to detecting, via display and/or hinge sensors 406/407, that IHS 100 has assumed a laptop posture from a closed or "off" posture, GUI OUT 403 may allow a full-screen desktop image, received as GUI IN 402, to be displayed first display 101 while second display 102 remains turned off or darkened. Upon receiving keyboard sensor data 408 indicating that keyboard 103 has been positioned over second display 102, GUI OUT 403 may produce a ribbon-type display or area 106 around the edge(s) of keyboard 103, for example, with interactive and/or touch selectable virtual keys, icons, menu options, pallets, etc. If keyboard sensor data 408 then indicates that keyboard 103 has been turned off, for example, GUI OUT 403 may produce an OSK on second display 102.

Additionally, or alternatively, touch control feature 404 may be produced to visually delineate touch input area 107 of second display 102, to enable its operation as a user input device, and to thereby provide an UI interface commensurate with a laptop posture. Touch control feature 404 may turn palm or touch rejection on or off in selected parts of display(s) 101/102. Also, GUI OUT 403 may include a visual outline displayed by second display 102 around touch input area 107, such that palm or touch rejection is applied outside of the outlined area, but the interior of area 107 operates as a virtual trackpad on second display 102.

Multi-form factor configuration engine 401 may also produce other commands 405 in response to changes in display posture and/or keyboard state or arrangement, such as commands to turn displays 101/102 on or off, enter a selected power mode, charge or monitor a status of an accessory device (e.g., docked in hinge 104), etc.

Figure 5:
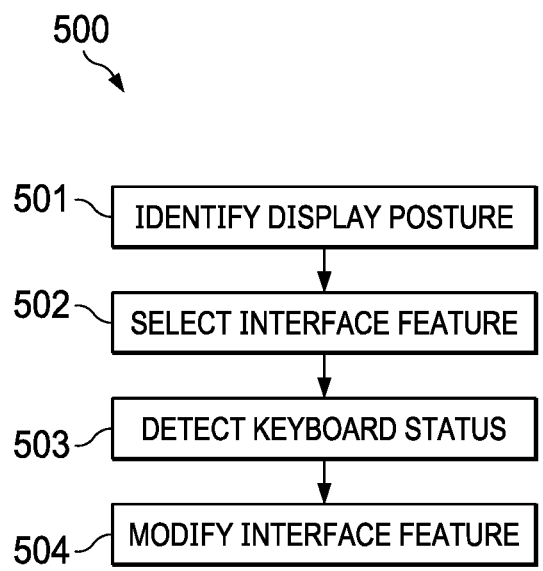
FIG. 5 is a flowchart of a method for configuring multi-form factor IHSs, according to some embodiments.

FIG. 5 is a flowchart of method 500 for configuring multi-form factor IHSs. In various embodiments, method 500 may be performed by multi-form factor configuration engine 401 under execution of processor 201. At block 501, method 500 includes identifying a display posture—that is, a relative physical arrangement between first display 101 and second display 102. For example, block 501 may use sensor data received from displays 101/102 and/or hinge 104 to distinguish among the various postures shown below.

At block 502, method 500 selects a UI feature corresponding to the identified posture. Examples of UI features include, but are not limited to: turning a display on or off; displaying a full or partial screen GUI; displaying a ribbon area; providing a virtual trackpad area; altering touch control or palm rejection settings (e.g., on/off area(s) of a display, touch sensitivity, etc.); adjusting the brightness and contrast of a display; selecting a mode, volume, and/or or directionality of audio reproduction; etc.

At block 503, method 500 may detect the status of keyboard 103. For example, block 503 may determine that keyboard 103 is on or off, resting between two closed displays, horizontally sitting atop display(s) 101/102, or next to display(s) 101/102. Additionally, or alternatively, block 503 may determine the location or position of keyboard 103 relative to display 102, for example, using Cartesian coordinates. Additionally, or alternatively, block 503 may determine an angle between keyboard 103 and displays 101/102 (e.g., a straight angle if display 102 is horizontal, or a right angle if display 102 is vertical).

Then, at block 504, method 500 may modify the UI feature in response to the status of keyboard 103. For instance, block 504 may cause a display to turn on or off, it may change the size or position of a full or partial screen GUI or a ribbon area, it may change the size or location of a trackpad area with changes to control or palm rejection settings, etc. Additionally, or alternatively, block 504 may produce a new interface feature or remove an existing feature, associated with a display posture, in response to any aspect of the keyboard status meeting a selected threshold of falling within a defined range of values.

FIGS. 6A-C, 7A-J, 8A-D, and 9A-F illustrate examples of laptop, tablet, book, and display postures which may be detected by operation of block 501 of method 500 during execution of multi-form factor configuration engine 401 by IHS 100.

Figure 6A:
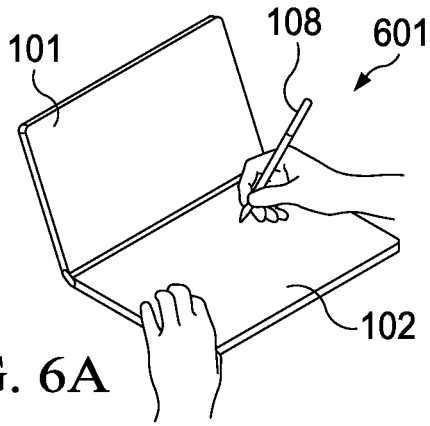
FIGS. 6A-C, 7A-J, 8A-D, and 9A-F illustrate examples of laptop, tablet, book, and display postures, respectively, according to some embodiments.
Figure 6B:
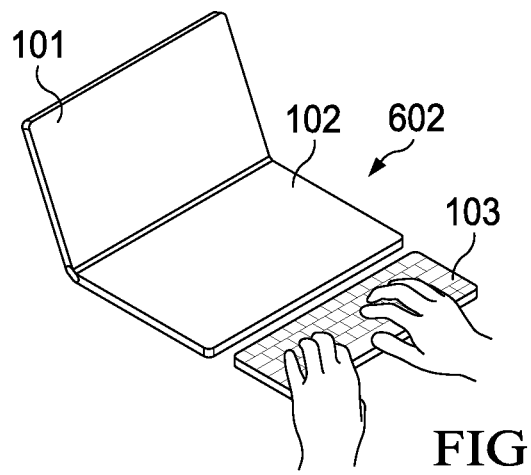
Figure 6C:
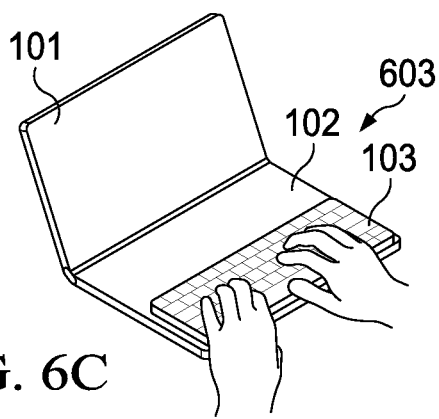

Particularly, FIGS. 6A-C show a laptop posture, where a first display surface of first display 101 is facing the user at an obtuse angle with respect to a second display surface of second display 102, and such that second display 102 is disposed in a horizontal position, with the second display surface facing up. In FIG. 6A, state 601 shows a user operating IHS 100 with a stylus or touch on second display 102. In FIG. 6B, state 602 shows IHS 100 with keyboard 103 positioned off the bottom edge or long side of second display 102, and in FIG. 6C, state 603 shows the user operating keyboard 103 atop second display 102.

Figure 7A:
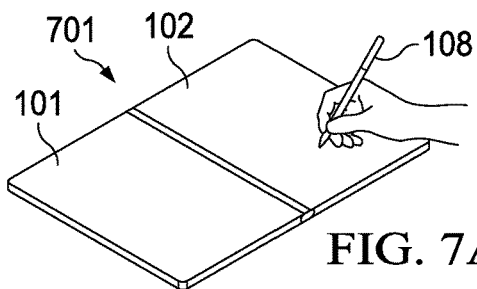
Figure 7B:
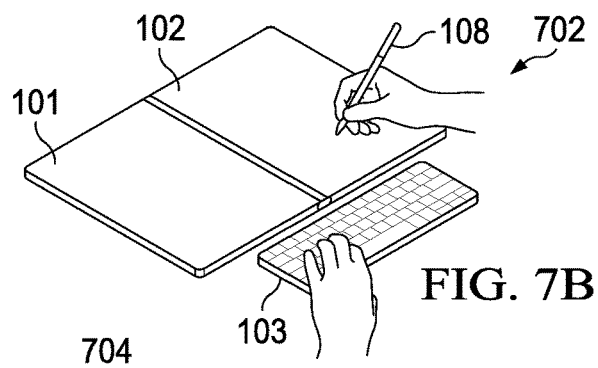
Figure 7C:
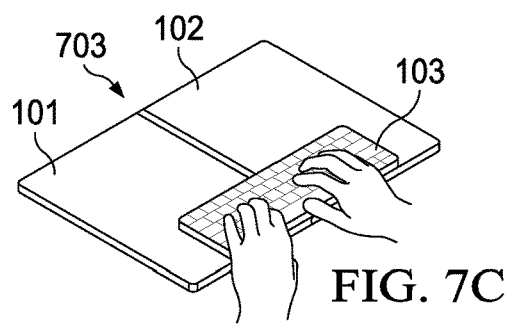
Figure 7D:
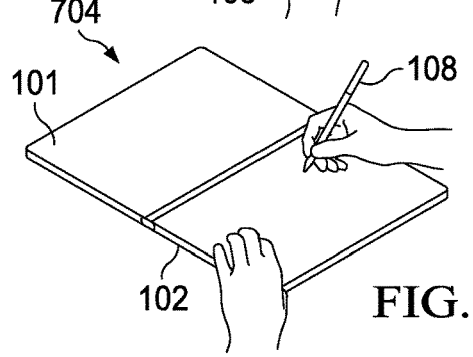
Figure 7E:
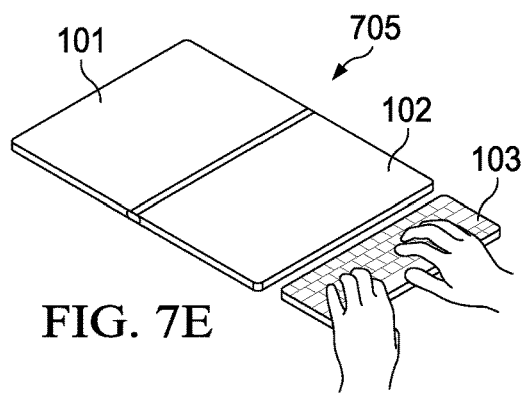
Figure 7F:
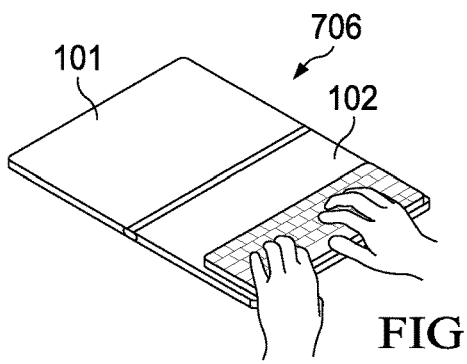

FIGS. 7A-J show a tablet posture, where first display 101 is at a straight angle with respect to second display 102, such that first and second displays 101 and 102 are disposed in a horizontal position, with the first and second display surfaces facing up. Specifically, FIG. 7A shows state 701 where IHS 100 is in a side-by-side, portrait orientation without keyboard 103, FIG. 7B shows state 702 where keyboard 103 is being used off the bottom edges or short sides of display(s) 101/102, and FIG. 7C shows state 703 where keyboard 103 is located over both displays 101 and 102. In FIG. 7D, state 704 shows IHS 100 in a side-by-side, landscape configuration without keyboard 103, in FIG. 7E state 705 shows keyboard 103 being used off the bottom edge or long side of second display 102, and in FIG. 7F state 706 shows keyboard 103 on top of second display 102.

Figure 7G:
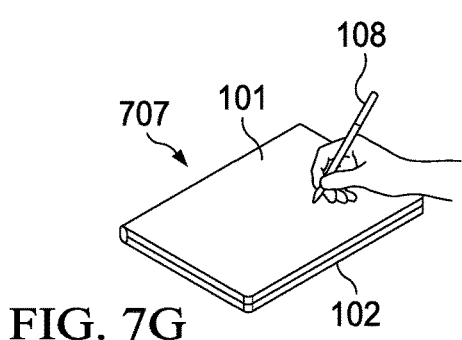
Figure 7H:
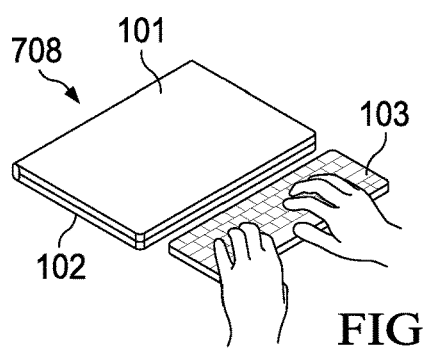
Figure 7I:
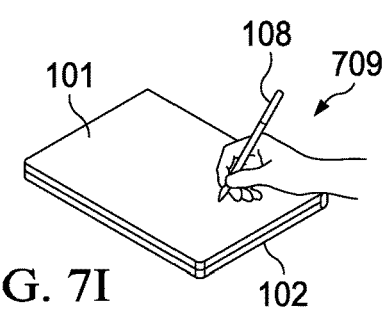
Figure 7J:
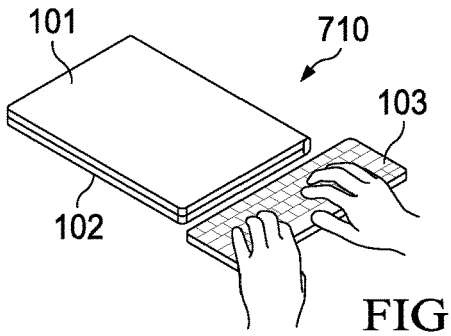

In FIG. 7G, state 707 shows first display 101 rotated around second display 102 via hinge 104 such that the display surface of second display 102 is horizontally facing down, and first display 101 rests back-to-back against second display 102, without keyboard 103; and in FIG. 7H, state 708 shows the same configuration, but with keyboard 103 placed off the bottom or long edge of display 102. In FIGS. 7I and 7J, states 709 and 710 correspond to states 707 and 708, respectively, but with IHS 100 in a portrait orientation.

Figure 8A:
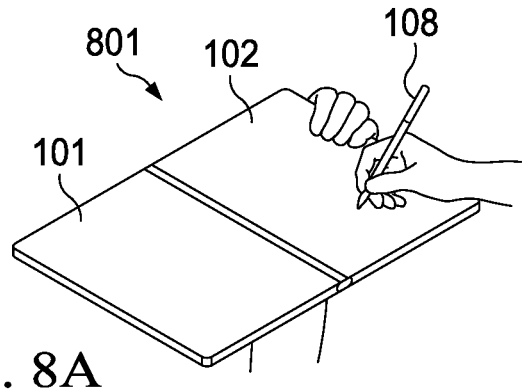
Figure 8B:
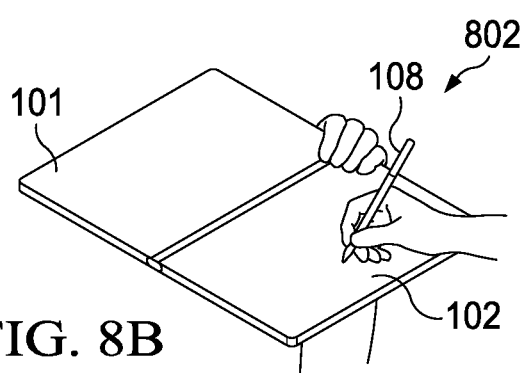
Figure 8C:
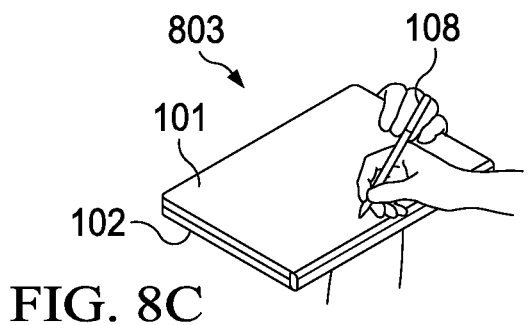
Figure 8D:
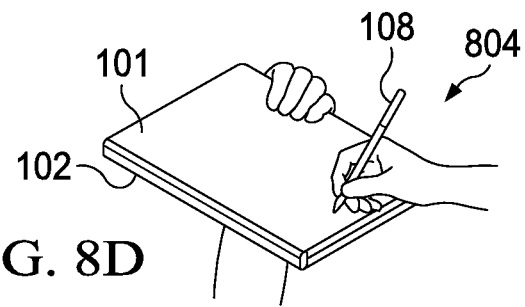
Figure 9A:
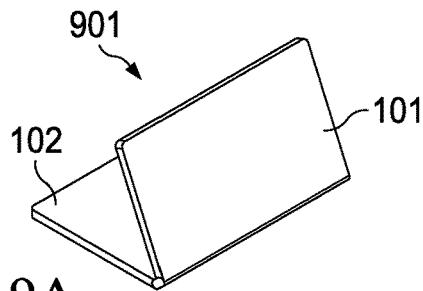
Figure 9B:
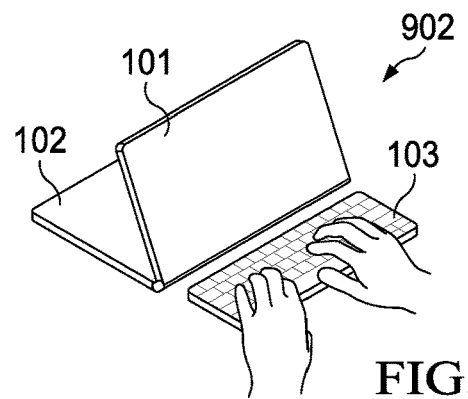

FIG. 8A-D show a book posture, similar to the tablet posture of FIGS. 7A-J, but such that neither one of displays 101 or 102 is horizontally held by the user and/or such that the angle between the display surfaces of the first and second displays 101 and 102 is other than a straight angle. In FIG. 8A, state 801 shows dual-screen use in portrait orientation, in FIG. 8B state 802 shows dual-screen use in landscape orientation, in FIG. 8C state 803 shows single-screen use in landscape orientation, and in FIG. 8D state 804 shows single-screen use in portrait orientation.

Figure 9C:
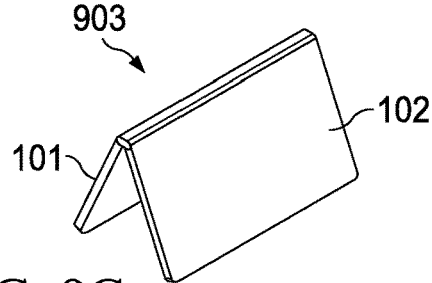
Figure 9D:
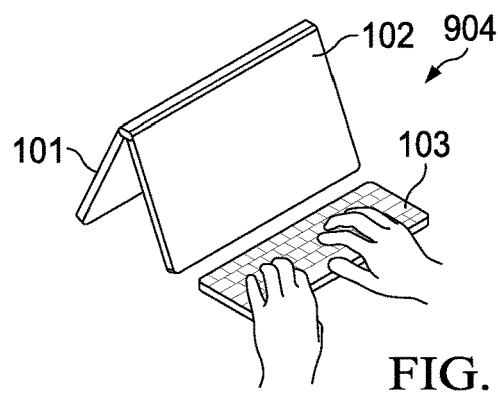
Figure 9E:
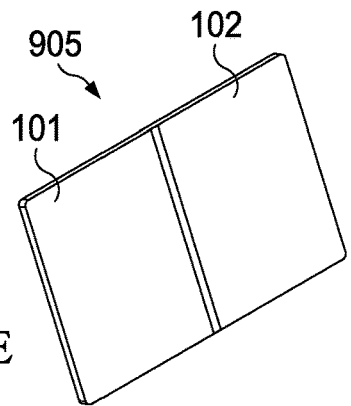
Figure 9F:
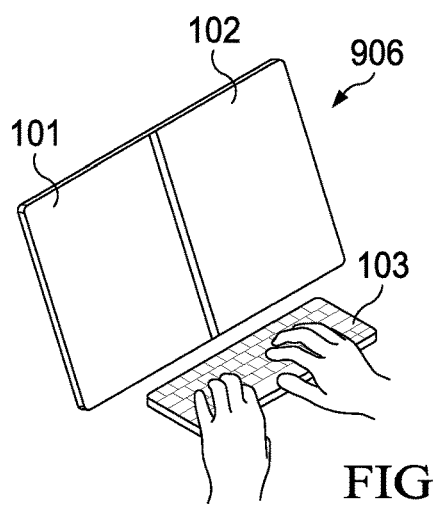

FIGS. 9A-F show a display posture, where first display 100 is at an acute angle with respect to second display 102, and/or where both displays are vertically arranged in a portrait orientation. Particularly, in FIG. 9A state 901 shows a first display surface of first display 102 facing the user and the second display surface of second display 102 horizontally facing down in a stand configuration ("stand"), whereas in FIG. 9B state 902 shows the same stand configuration but with keyboard 103 used off the bottom edge or long side of display 101. In FIG. 9C, state 903 shows a display posture where display 102 props up display 101 in a tent configuration ("tent"), and in FIG. 9D, state 904 shows the same tent configuration but with keyboard 103 used off the bottom edge or long side of display 101. In FIG. 9E, state 905 shows both displays 101 and 102 resting vertically or at display angle, and in FIG. 9F state 906 shows the same configuration but with keyboard 103 used off the bottom edge or long side of display 101.

It should be noted that the aforementioned postures, and their various respective keyboard states, are described for sake of illustration. In different embodiments, however, other postures and keyboard states may be used, for example, depending upon the type of hinge coupling the displays, the number of displays used, or other accessories. For instance, when IHS 100 is chargeable via a charging or docking station, the connector in the docking station may be configured to hold IHS 100 at angle selected to facility one of the foregoing postures (e.g., keyboard states 905 and 906).

FIGS. 10A-C illustrate a first example use-case of method 500 in the context of a laptop posture. In state 1000A of FIG. 10A, first display 101 shows primary display area 1001, keyboard 103 sits atop second display 102, and second display 102 provides UI features such as first ribbon area 1002 (positioned between the top long edge of keyboard 103 and hinge 104) and touch area 1003 (positioned below keyboard 103). As keyboard 103 moves up or down on the surface of display 102, ribbon area 1002 and/or touch area 1003 may dynamically move up or down, or become bigger or smaller, on second display 102. In some cases, when keyboard 103 is removed, a virtual OSK may be rendered (e.g., at that same location) on the display surface of display 102.

In state 1000B of FIG. 10B, in response to execution of method 500 by multi-form factor configuration engine 401, first display 101 continues to show main display area 1001, but keyboard 103 has been moved off of display 102. In response, second display 102 now shows secondary display area 1004 and also second ribbon area 1005. In some cases, second ribbon area 1005 may include the same UI features (e.g., icons, etc.) as also shown in area 1002, but here repositioned to a different location of display 102 nearest the long edge of keyboard 103. Alternatively, the content of second ribbon area 1005 may be different from the content of first ribbon area 1002.

In state 1000C of FIG. 10C, during execution of method 500 by multi-form factor configuration engine 401, IHS 100 detects that physical keyboard 103 has been removed (e.g., out of wireless range) or turned off (e.g., low battery), and in response display 102 produces a different secondary display area 1006 (e.g., smaller than 1004), as well as OSK 1007.

FIGS. 11A-C illustrate a second example use-case of method 500 in the context of a tablet posture. In state 1100A of FIG. 11A, second display 102 has its display surface facing up, and is disposed back-to-back with respect to second display 102, as in states 709/710, but with keyboard 103 sitting atop second display 102. In this state, display 102 provides UI features such primary display area 1101 and first ribbon area 1102, positioned as shown. As keyboard 103 is repositioned up or down on the surface of display 102, display area 1101, first ribbon area 1102, and/or touch area 1103 may also be moved up or down, or made bigger or smaller, by multi-form factor configuration engine 401.

In state 1100B of FIG. 11B, keyboard 103 is detected off of the surface of display 102. In response, first display 101 shows modified main display area 1103 and modified ribbon area 1104. In some cases, modified ribbon area 1104 may include the same UI features as area 1102, but here repositioned to a different location of display 102 nearest the long edge of keyboard 103. Alternatively, the content of second ribbon area 1104 may be different from the content of first ribbon area 1102. In some cases, the content and size of modified ribbon area 1104 may be selected in response to a distance between keyboard 103 and display 102.

In state 1100C of FIG. 11C, during continued execution of method 500, multi-form factor configuration engine 401 detects that physical keyboard 103 has been removed or turned off, and in response display 102 produces yet another display area 1105 (e.g., larger than 1003 or 1002), this time without an OSK.

In various embodiments, the different UI behaviors discussed in the aforementioned use-cases may be set, at least in part, by policy and/or profile, and stored in a preferences database for each user. In this manner, UI features and modifications of blocks 502 and 504, such as whether touch input area 1003 is produced in state 1000A (and/or its size and position on displays 101/102), or such as whether ribbon area 1102 is produced in state 1100A (and/or its size and position on displays 101/102), may be configurable by a user.

FIGS. 12A-D illustrate a 360-hinge implementation, usable as hinge 104 in IHS 100, in four different configurations 1200A-D, respectively. Particularly, 360-hinge 104 may include a plastic, acrylic, polyamide, polycarbonate, elastic, and/or rubber coupling, with one or more internal support, spring, and/or friction mechanisms that enable a user to rotate displays 101 and 102 relative to one another, around the axis of 360-hinge 104.

Hinge configuration 1200A of FIG. 12A may be referred to as a closed posture, where at least a portion of a first display surface of the first display 101 is disposed against at least a portion of a second display surface of the second display 102, such that the space between displays 101/102 accommodates keyboard 103. When display 101 is against display 102, stylus or accessory 108 may be slotted into keyboard 103. In some cases, stylus 108 may have a diameter larger than the height of keyboard 103, so that 360-hinge 104 wraps around a portion of the circumference of stylus 108 and therefore holds keyboard 103 in place between displays 101/102.

Hinge configuration 1200B of FIG. 12B shows a laptop posture between displays 101/102. In this case, 360-hinge 104 holds first display 101 up, at an obtuse angle with respect to first display 101. Meanwhile, hinge configuration 1200C of FIG. 12C shows a tablet, book, or display posture (depending upon the resting angle and/or movement of IHS 100), with 360-hinge 104 holding first and second displays 101/102 at a straight angle (180°) with respect to each other. And hinge configuration 1200D of FIG. 12D shows a tablet or book configuration, with 360-hinge 104 holding first and second displays 101 and 102 at a 360° angle, with their display surfaces in facing opposite directions.

Touch Input Switching

In various embodiments, systems and methods described herein may enable and/or implement different touch input modes for multi-form factor IHS 100, which may include, for example, switching between different navigation modes, switching between a stylus and a pointer/mouse, and/or switching between multiple displays and orientations (e.g., touch or non-touch displays, or horizontal/vertical orientations). In some implementations, by configuring IHS 100 to switch between direct mode (for "pen" use) and indirect mode (for "pointer/mouse" use) in response to one or more switch events (e.g., button push, gesture, etc.), a user can dynamically transition and/or choose between stylus and mouse-like navigation.

In a first example use-case, IHS 100 may receive a first input, using either stylus 108 or the user's finger(s), via secondary display 102 in direct mode, by producing or modifying an image on that display. Particularly, when operating in direct mode, the tip of stylus 108 may cause secondary display 102 to detect a touch operation or gesture via its touchscreen or digitizer, and to render an image near that tip (e.g., a line, a cursor, etc.) using its LCD, as the tip moves across the display under user manipulation.

Then, in response to a detected switch event, IHS 100 may process a second input received via the touchscreen or digitizer of secondary display 102 in pointer mode, at least in part, by producing or modifying an image on the LCD of primary display 101 at a display location (e.g., LCD pixel coordinates) that corresponds to a contact location (e.g., touchscreen coordinates) of the second input on secondary display 102. Moreover, in pointer mode, stylus 108 may behave as a mouse and control a cursor or pointer across both (or all) screens.

In certain situations, however, it may be confusing for a user to navigate a pointer on the same display (e.g., secondary display 102) where stylus 108 provides touch input. Particularly, users generally expect stylus 108 to operate as a pen when used in direct mode, and showing a graphic under the pen tip to show that IHS 100 is in pen mode is often unnatural. To address this, a second example use-case may enable a user to interact with ISH 100 in direct mode, and switches to a projected mode for other displays. When switching to the projected mode, a pointer or cursor may appear on primary display 101 while secondary display 102 is disabled. Moreover, touch or palm rejection settings may be disabled or modified, and/or an LCD backlight may be dimmed or turned off, in response to the event and/or while in projected mode.

In various embodiments, switching modes may be achieved by toggling a button or sliding a switch on the body of stylus 108, moving a cursor or pointer out of a display's frame, and/or performing flick gestures (using stylus 108 or the user's fingers) to move content (e.g., an application window, an image, a file, etc.) between displays 101/102. As used herein, the term "flick" refers to a unidirectional stylus/finger gesture that requires a user to contact the digitizer in a quick flicking motion characterized by high speed and a high degree of straightness, and it may be identified by its direction.

FIGS. 13A-D illustrate examples of different stylus and/or finger touch input modes. In these configurations, IHS 100 is in a laptop posture with hinge 104 at an angle such that secondary display 102 sits on a horizontal surface and primary display 101 faces the user.

Figure 13A:
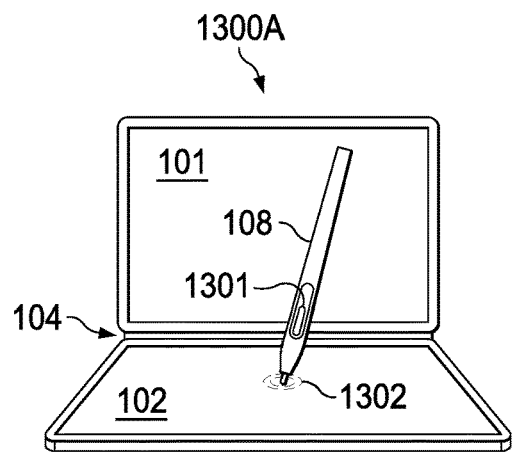
FIGS. 13A-D illustrate examples of different stylus and/or finger touch input modes, according to some embodiments.
Figure 13B:
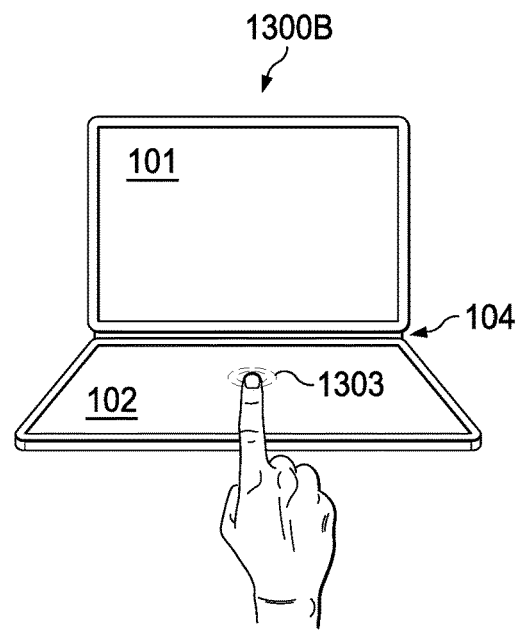

Particularly, in FIG. 13A stylus 108 is used to provide an input via secondary display 102 in direct mode. Stylus 108 may include switch 1301, such as a slide or toggle button that, when activated, causes IHS 100 to enter direct mode. In direct mode, a touch input received from stylus 108 at a contact location of secondary display 102 may cause image 1302 (e.g., cursor, pointer, line, etc.) to appear or be manipulated at a corresponding display location in secondary display 102. FIG. 13B shows a similar configuration as FIG. 13A, but with the user employing their finger as touch instrument at display/contact location 1303.

Figure 13C:
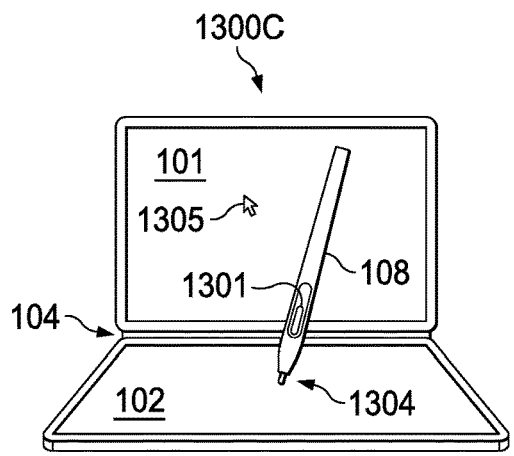
Figure 13D:
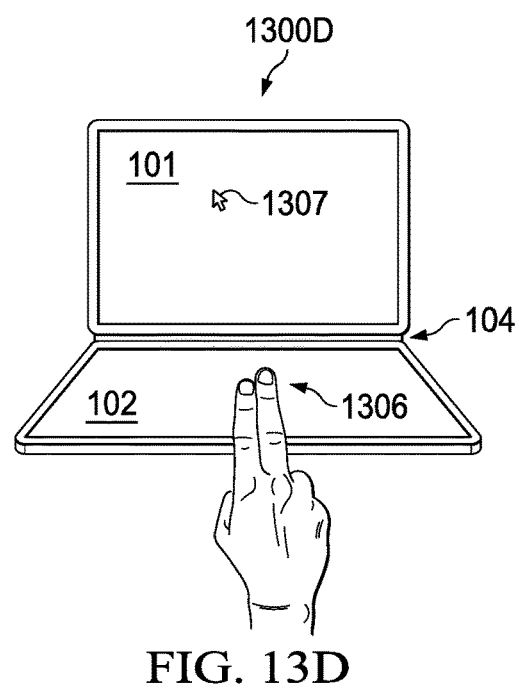

In FIG. 13C, stylus 108 is used to provide an input via secondary display 102 in pointer mode, for example upon activation of switch 1301. In pointer mode, a touch input received from tip 1304 of stylus 108 at a contact location of secondary display 102 causes image 1305 (e.g., cursor, pointer, line, etc.) to appear or be manipulated at a corresponding display location on primary display 101. FIG. 13D shows a similar configuration as FIG. 13C, but with the user employing their fingers as touch instrument at display/contact location 1306, and a corresponding image appearing or being manipulated at display location 1307.

Figure 14:
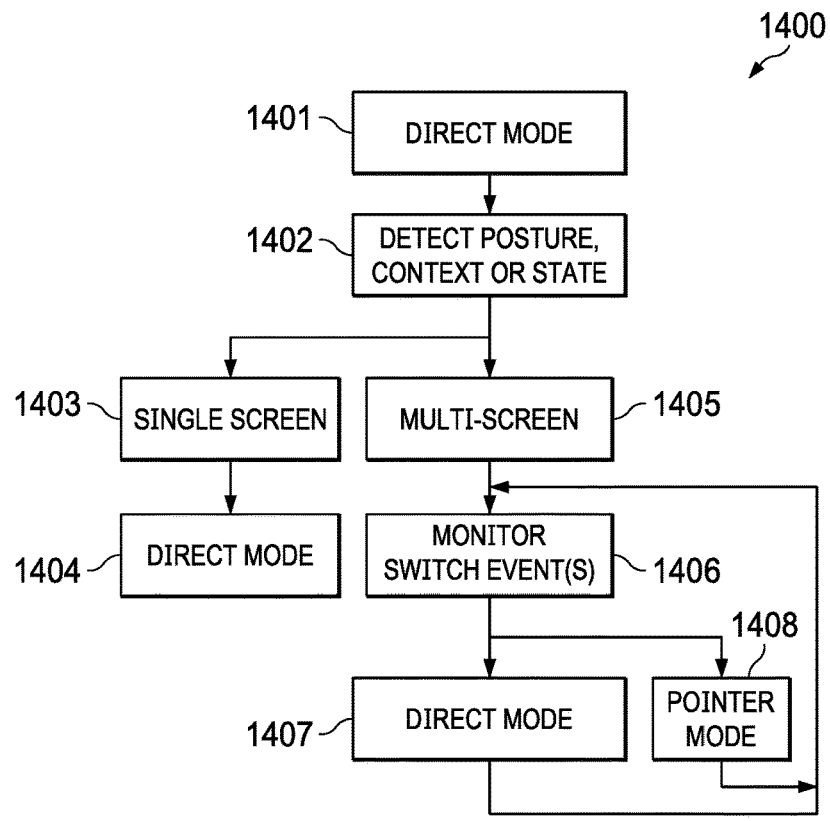
FIG. 14 is a flowchart of an example of a touch input switching method, according to some embodiments.

FIG. 14 is a flowchart of an example of touch input switching method 1400. In some embodiments, at least a portion of method 1400 may be performed by display or touch controller(s) 204 in cooperation with multi-form factor configuration engine 401 under execution of processor 201. Particularly, method 1400 starts at block 1401 by setting IHS 100 in direct mode. At block 1402, method 1400 detects a posture, context, and/or state of IHS 100 (e.g., hinge angle). Block 1403 determines that IHS 100 is being used as a single screen and block 1404 maintains IHS 100 in direct mode. Otherwise, block 1405 determines that IHS 100 is being used as a multi-screen IHS and control passes to block 1406, where method 1400 monitors for a switch event. In response detecting such an event, method 1400 causes IHS 100 to enter direct mode at block 1407 or pointer mode at block 1408—e.g., depending upon the status of switch 1301.

Figure 15:
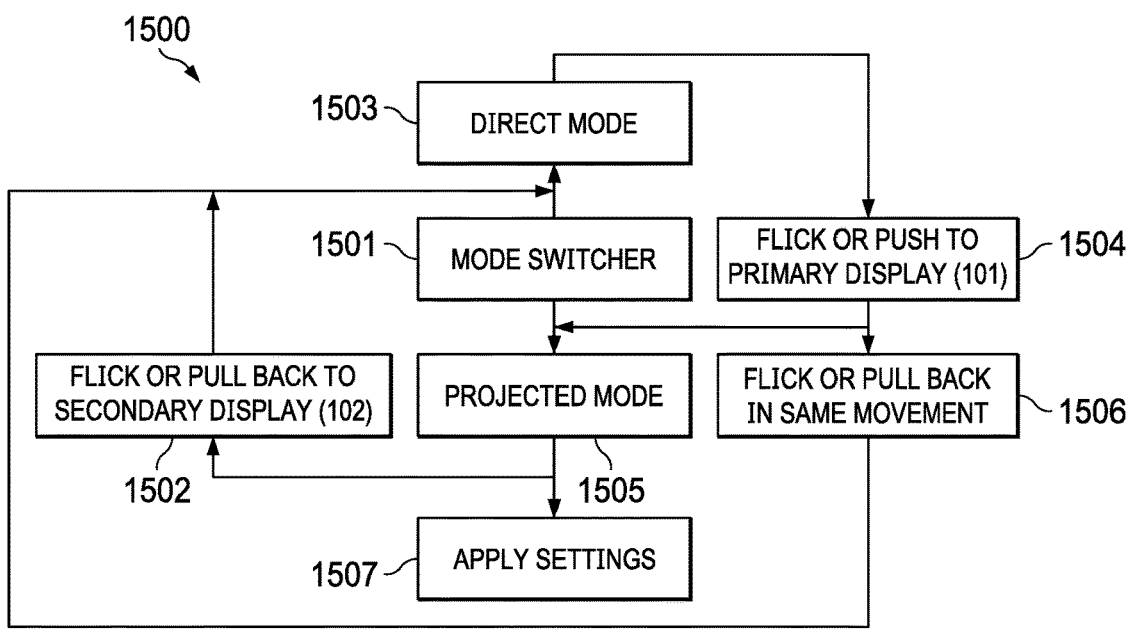
FIG. 15 is a flowchart of another example of a touch input switching method, according to some embodiments.

FIG. 15 is a flowchart of an example of another touch input switching method 1500. At least a portion of method 1500 may be performed by display or touch controller(s) 204 in cooperation with multi-form factor configuration engine 401 under execution of processor 201. Particularly, method 1500 starts at block 1500, where mode switcher block or service 1501 detects a touch event and, in response, causes IHS 100 to enter direct mode 1503 or projected mode 1505—e.g., depending upon the status of switch 1301.

In some cases, switching modes with content selected may transport it from the tip of stylus 108 to the cursor moving that content to primary display 101. For example, method 1500 may determine that content is selected prior to the event, and, in response to the event, IHS 100 may move the content between the primary and secondary displays.

From block 1503, if the user flicks or pushes content (e.g., a selected image, an application window, etc.) from secondary display 102 to primary display 101 at block 1504, IHS 100 enters projected mode 1505; unless block 1506 detects a flick back or pull back gesture in the same movement, in which case IHS 100 remains in direct mode 1503. While IHS 100 is in projected mode 1505, if the user flicks or pulls back content (e.g., an image, a window, etc.) from primary display 101 to secondary display 102 at block 1502, IHS 100 may enter direct mode 1503.

When IHS 100 is operating in projected mode 1505, method 1500 may also apply projected mode settings 1507. For example, projected mode settings 1507 may include a brightness reduction for secondary display 102 and/or a palm rejection setting (e.g., increase or lower a touch sensitivity of the touchscreen or digitizer, etc.). In some cases, the amount and/or degree to which each setting to secondary display 102 is applied may be proportional to and/or selected in response to current hinge angle and/or display posture of IHS 100.

As mentioned above, various systems and methods described herein operate with touch inputs received from stylus 108 (e.g., FIGS. 13A and 13C). Additionally, or alternatively, finger touch may be used (e.g., FIGS. 13B and 13D).

Accordingly, in addition to the input modes described above, FIG. 16 illustrates other finger touch input modes and/or settings, according to some embodiments. Particularly, mode 1600A shows that when a user employs single finger 1601 on the touchscreen or digitizer of secondary display 102, touch point 1602 may be shown on secondary display 102. Mode 1600B shows that when a user employs two fingers 1603 on the touchscreen or digitizer of secondary display 102, IHS 100 may enter "turbo mouse" mode or effect (on either display) where cursor 1604 may move faster (than with one finger) to navigate primary display 101 in pointer mode.

If the user returns to one-finger operation 1605 in 1600C, IHS 100 may maintain the "turbo mouse" effect previously set 1606 in pointer mode. If the user then applies three fingers 1607 to secondary display 102 in mode 1600D, IHS 100 may execute or display a screen or application window scrolling command or control 1608. Mode 1600E shows the user returning to a one-finger touch 1609 to return to touch 1610 on secondary display 102 in direct mode.

In some cases, a touch gesture over the trackpad or digitizer of secondary display 102 may be used as the switch event between pointer/mouse modes. For example, a three-finger tap or swiping gesture may switch pointer mode on. Other options may include using a second hand to toggle pointer mode on and off; in which case the second hand may have additional gestures for cut/copy/paste operations, or the like.

Figure 16:
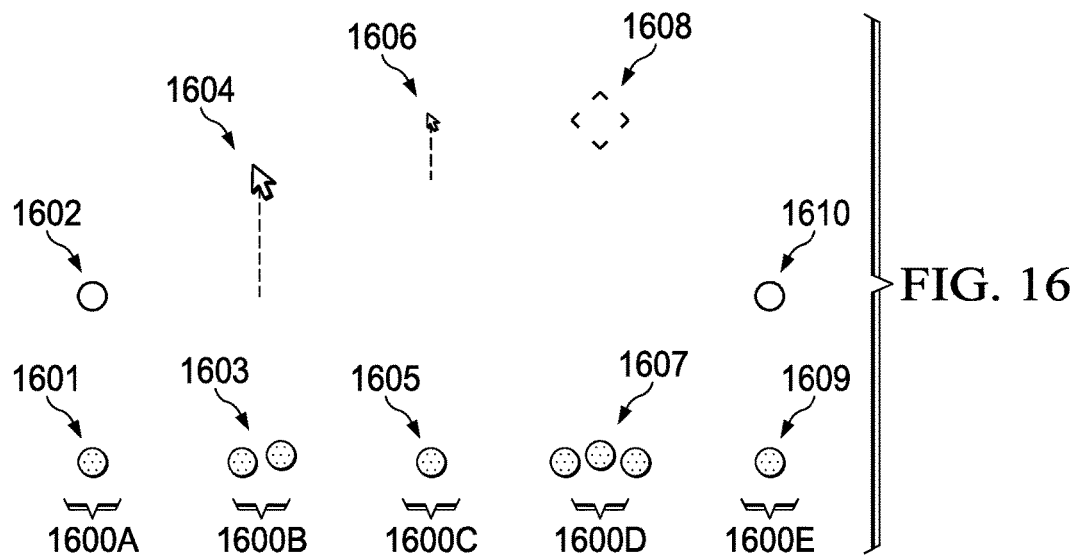
FIG. 16 illustrates examples of different finger touch input modes, according to some embodiments.

Back to the example of FIG. 16, a two-finger tap/slide may start the user off in turbo-mouse mode, where the user can quickly navigate the pointer anywhere across any display. In some cases, different acceleration and speed settings may be used for cursor movement in each of displays 101/102, and may be selected in response to a current hinge angle. By releasing one finger, the user can continue to navigate the pointer with more precision. The user can also continue to navigate the pointer any time by initiating a two finger tap/slide, effectively turning secondary display 102 (e.g., in laptop posture) into a trackpad.

In some embodiments, a user may invoke an on-screen or virtual trackpad on secondary display 102. In some cases, such a trackpad may have two, three, or more zones (e.g., upper area-only, lower area-only, both, etc.) to enable quick navigation and screen switching without requiring a user to have to visually locate the pointer on a given display first.

Figure 17:
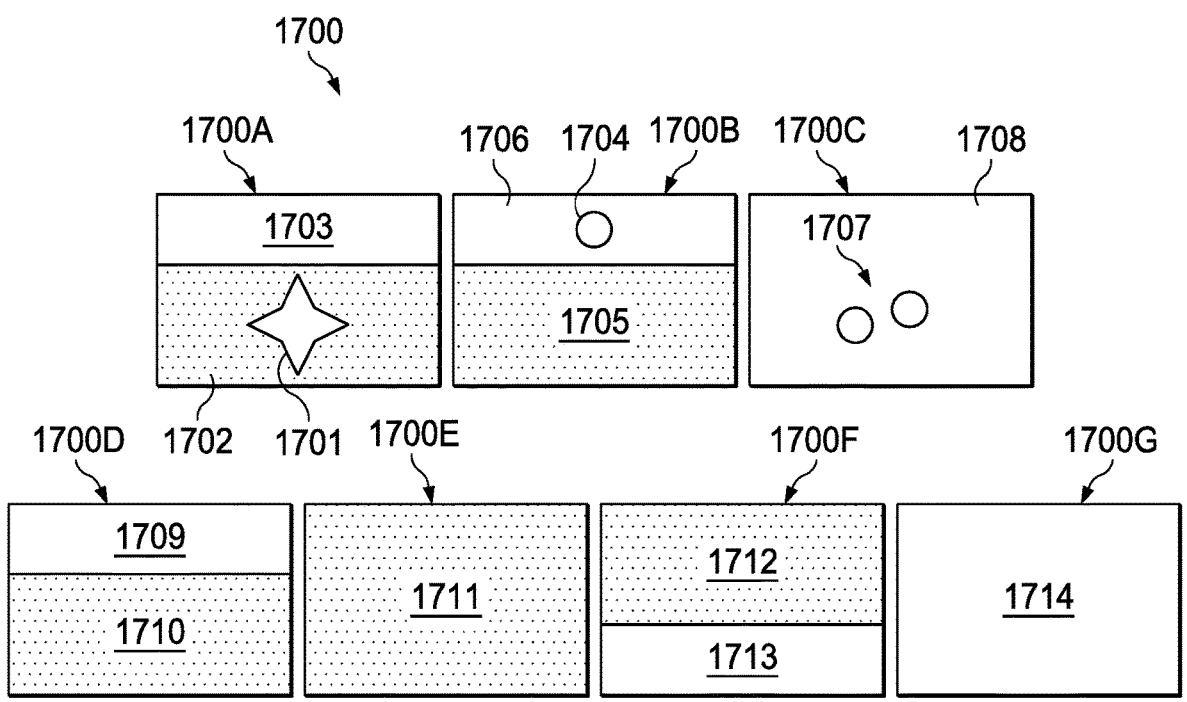
FIG. 17 illustrates examples of display switching methods using an on-screen trackpad, according to some embodiments.

FIG. 17 illustrates examples of display switching methods 1700 using an on-screen trackpad. In some cases, a virtual or on-screen touchpad may occupy the entire display surface of secondary display 102. In configuration 1700A, normal mouse use may be employed when the user's finger touches point 1701 of main section 1702, outside of top area 1703. In configuration 1700B, tap action 1704 in top area 1706 (when the user's acts outside of main area 1705) may cause a cursor or pointer to appear in primary display 101. And, in configuration 1700C, a two-finger tap 1707 in area 1708 may trigger a turbo mouse effect.

Configurations 1700D-G show different brightness settings that may be used to visually delineate various touch sections of a virtual touchscreen rendered on secondary display 102. Particularly, configuration 1700D shows top section 1709 with a first (higher) brightness setting and middle section 1710 with a second (lower) brightness setting. Configuration 1700E shows entire secondary display 102 dimmed 1711 during normal use (e.g., pointer mode). Configuration 1700F shows main area 1712 dimmed relative to bottom zone 1713. And configuration 1700G shows entire secondary display 102 brightened 1714 when in turbo mouse.

Figure 18:
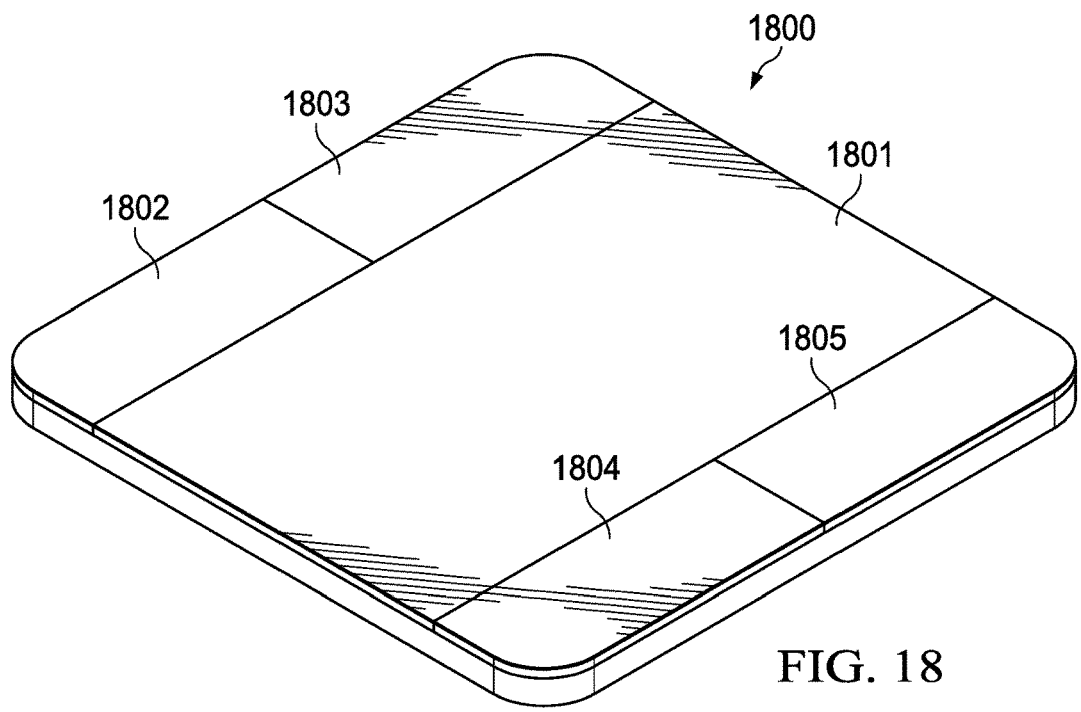
FIG. 18 illustrates an example of a trackpad, according to some embodiments.

FIG. 18 illustrates an example of trackpad 1800 according to some embodiments. In some cases, the virtual trackpad of FIG. 17 may be implemented as a physical device, in the form of an IHS accessory 1800 other the like. In this case, trackpad 1800 includes main area 1801, top-left area (or button) 1802, top-right area (or button) 1803, bottom-left area (or button) 1804, and bottom-right area (or button) 1805.

Figure 19:
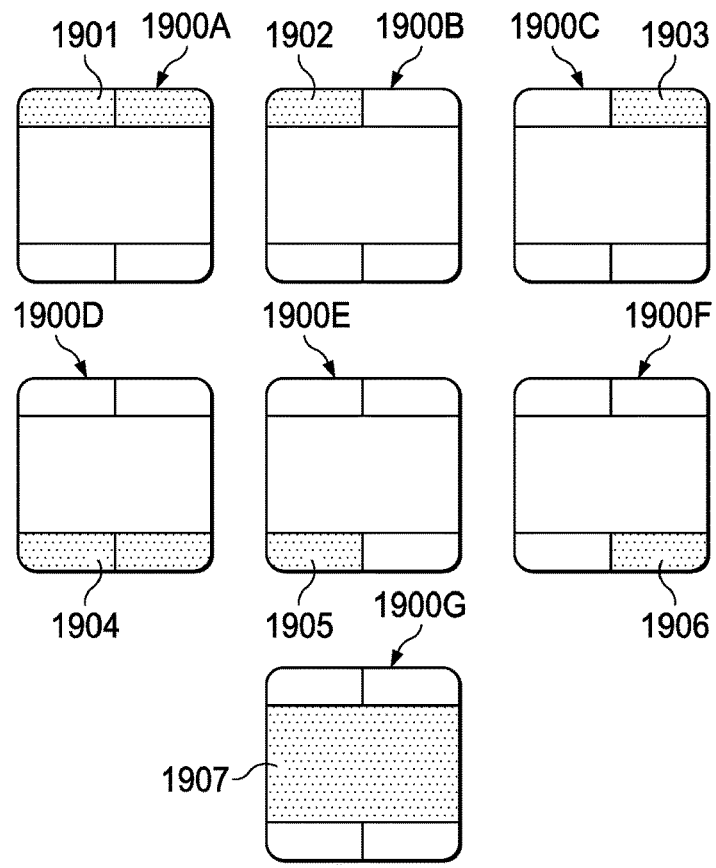
FIG. 19 illustrates use of a trackpad in various display switching methods, according to some embodiments.

FIG. 19 illustrates use of trackpad 1800 in various examples of display switching methods 1900A-G. In example 1900A, a user activates top portion 1901 of trackpad 1800 to start navigating in primary screen 101. In example 1900B, the user activates top-left portion 1902 of trackpad 1800 to start navigating on a left side of primary screen 101, or on a left-side external display (disposed on the left of IHS 100). In example 1900C, the user activates top-right portion 1903 of trackpad 1800 to start navigating on a right side of primary screen 101, or on a right-side external display (disposed on the right of IHS 100). In example 1900D, the user activates bottom portion 1904 of trackpad 1800 to start navigating on a bottom side of secondary display 102. In example 1900E, the user activates bottom-left portion 1904 of trackpad 1800 to start navigating on a bottom-left side of secondary display 102. In example 1900F, the user activates bottom-right portion 1906 of trackpad 1800 to start navigating on a bottom-right side of secondary display 102. And in example 1900G, the user resumes navigation in place 1907.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An Information Handling System (IHS), comprising:
a processor;
a primary display coupled to the processor;
a secondary display coupled to the processor; and
a memory coupled to the processor, the memory having program instructions stored thereon that, upon execution, cause the IHS to:
in response to detection of a tablet posture, maintain a direct mode and process a first input received via a secondary display, at least in part, to produce or modify a first image on the secondary display; and
in response to detection of a laptop posture: (a) switch to a pointer mode and process a second input received via the secondary display, at least in part, to produce or modify a second image on the primary display at a display location that corresponds to a contact location of the second input, and (b) change a display setting to visually delineate a touch section of a virtual trackpad on the secondary display, wherein the display setting comprises a brightness setting, wherein to change the display setting, the program instructions, upon execution, further cause the IHS to: (a) apply a first brightness setting to a first portion of the touch section, and (b) apply a second brightness setting to a second portion of the touch section, and wherein at least one of: (a) the first portion of the touch section is smaller than the second portion and the first brightness setting is brighter than the second brightness setting, or (b) the first portion of the touch section is smaller than the second portion and the first brightness setting is dimmer than the second brightness setting.

2. The IHS of claim 1, wherein the program instructions, upon execution, cause the IHS to switch to the pointer mode in response to both: the detection of the laptop posture and an actuation of a switch on a stylus.

3. The IHS of claim 1, wherein the program instructions, upon execution, cause the IHS to switch to the pointer mode in response to both: the detection of the laptop posture and a detection of a two-finger gesture.

4. The IHS of claim 1, wherein the program instructions, upon execution, cause the IHS to switch to the pointer mode in response to both: the detection of the laptop posture and a detection of a flick gesture.

5. The IHS of claim 4, wherein the program instructions, upon execution, further cause the IHS to, in response to the detection of the laptop posture, move content between the primary and secondary displays.

6. The IHS of claim 1, wherein the display setting comprises a palm rejection setting.

7. The IHS of claim 1, wherein the secondary display is integrated into the IHS, and wherein the primary display comprises an external monitor.

8. The IHS of claim 1, wherein the primary display is coupled to the secondary display via a hinge.

9. The IHS of claim 8, wherein the program instructions, upon execution, cause the IHS to switch to the pointer mode in response to both: the detection of the laptop posture and a detection of a change in an angle of the hinge.

10. The IHS of claim 1, wherein the program instructions, upon execution, further cause the IHS to, in response to a touch event detected on a top section of the virtual trackpad, transport a cursor from the secondary display to the primary display.

11. The IHS of claim 1, wherein the program instructions, upon execution, further cause the IHS to, in response to a touch event detected on a bottom section of the virtual trackpad, transport a cursor from the primary display to the secondary display.

12. The IHS of claim 1, wherein the virtual trackpad occupies an entire display surface of the secondary display.

13. The IHS of claim 1, wherein the touch section is selected from the group consisting of: a top area of the virtual trackpad, and a main section of the virtual trackpad.

14. A hardware memory device having program instructions stored thereon that, upon execution by an Information Handling System (IHS), cause the IHS to:
in response to detection of a tablet posture, maintain a direct mode and process a first input received via a secondary display, at least in part, to produce or modify a first image on the secondary display; and
in response to detection of a laptop posture: (a) switch to a pointer mode and process a second input received via the secondary display, at least in part, to produce or modify a second image on the primary display at a display location that corresponds to a contact location of the second input, and (b) change a display setting to visually delineate a touch section of a virtual trackpad on the secondary display, wherein the display setting comprises a brightness setting, wherein to change the display setting, the program instructions, upon execution, further cause the IHS to: (a) apply a first brightness setting to a first portion of the touch section, and (b) apply a second brightness setting to a second portion of the touch section, and wherein at least one of: (a) the first portion of the touch section is smaller than the second portion and the first brightness setting is brighter than the second brightness setting, or (b) the first portion of the touch section is smaller than the second portion and the first brightness setting is dimmer than the second brightness setting.

15. The hardware memory device of claim 14, wherein the program instructions, upon execution, cause the IHS to switch to the pointer mode in response to both: the detection of the laptop posture and an actuation of a switch on a stylus.

16. The hardware memory device of claim 14, wherein the program instructions, upon execution, cause the IHS to switch to the pointer mode in response to both: the detection of the laptop posture and a detection of a two-finger gesture.

17. The hardware memory device of claim 14, wherein the program instructions, upon execution, cause the IHS to switch to the pointer mode in response to both: the detection of the laptop posture and a detection of a flick gesture.

18. A method, comprising:
in response to detection of a tablet posture of an Information Handling System (IHS), maintaining a direct mode and process a first input received via a secondary display, at least in part, by producing or modifying a first image on the secondary display; and in response to detection of a laptop posture of the IHS: (a) switching to a pointer mode and process a second input received via the secondary display, at least in part, by producing or modifying a second image on the primary display at a display location that corresponds to a contact location of the second input, and (b) changing a display setting to visually delineate a touch section of a virtual trackpad on the secondary display, wherein the display setting comprises a brightness setting, wherein changing the display setting further comprises: (a) applying a first brightness setting to a first portion of the touch section, and (b) applying a second brightness setting to a second portion of the touch section, and wherein at least one of: (a) the first portion of the touch section is smaller than the second portion and the first brightness setting is brighter than the second brightness setting, or (b) the first portion of the touch section is smaller than the second portion and the first brightness setting is dimmer than the second brightness setting.

19. The method of claim 18, wherein switching to the pointer mode occurs in response to both: the detection of the laptop posture and a detection of a two-finger gesture.

20. The method of claim 18, switching to the pointer mode occurs in response to both: the detection of the laptop posture and a detection of a flick gesture.

* * * * *